(12) United States Patent
Noguchi

(10) Patent No.: US 12,727,481 B2
(45) Date of Patent: Sep. 1, 2026

(54) SEMICONDUCTOR DEVICE COMPRISING A SEMICONDUCTOR SUBSTRATE AND A PLURALITY OF CONCAVE PORTIONS THAT EXTEND ALONG A DIRECTION PERPENDICULAR TO A DIRECTION IN WHICH THE SEMICONDUCTOR SUBSTRATE IS SUSCEPTIBLE TO WARPING MOST AND METHOD OF MANUFACTURING SEMICONDUCTOR DEVICE

(71) Applicant: Mitsubishi Electric Corporation, Tokyo (JP)

(72) Inventor: Tomoaki Noguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 489 days.

(21) Appl. No.: 18/317,777

(22) Filed: May 15, 2023

(65) Prior Publication Data

US 2024/0006343 A1 Jan. 4, 2024

(30) Foreign Application Priority Data

Jun. 30, 2022 (JP) ................................. 2022-105869

(51) Int. Cl.
*H10D 30/66* (2025.01)
*H10D 30/01* (2025.01)
(Continued)

(52) U.S. Cl.
CPC ...... *H10W 42/121* (2026.01); *H10D 30/0291* (2025.01); *H10D 30/66* (2025.01);
(Continued)

(58) Field of Classification Search
CPC . H01L 23/562; H01L 21/3043; H10D 62/117; H10D 64/01; H10D 64/252;
(Continued)

(56) References Cited

U.S. PATENT DOCUMENTS

2016/0189955 A1* 6/2016 Horii ................. H01L 21/02529 257/77
2019/0355840 A1 11/2019 Mori et al.
(Continued)

FOREIGN PATENT DOCUMENTS

JP H06-151884 A 5/1994
JP 2006-156658 A 6/2006
(Continued)

OTHER PUBLICATIONS

"Notice of Reasons for Refusal" Office Action issued in JP 2022-105869; mailed by the Japanese Patent Office on Jul. 29, 2025.

*Primary Examiner* — Shahed Ahmed
(74) *Attorney, Agent, or Firm* — Studebaker Brackett PLLC

(57) ABSTRACT

A semiconductor device includes a semiconductor substrate having a first surface, a second surface facing the first surface, and an outline, and an impurity region located on a side of the first surface in the semiconductor substrate. The second surface has a plurality of concave portions, and each of the plurality of concave portions open toward a side opposite to the first surface and extend along a direction perpendicular to a direction in which the semiconductor substrate is susceptible to warping most.

9 Claims, 30 Drawing Sheets

(51) Int. Cl.

| | |
|---|---|
| ***H10D 62/10*** | (2025.01) |
| ***H10D 64/01*** | (2025.01) |
| ***H10D 64/23*** | (2025.01) |
| ***H10P 52/00*** | (2026.01) |
| ***H10W 42/00*** | (2026.01) |
| *H10D 62/832* | (2025.01) |

(52) U.S. Cl.
CPC ........... *H10D 62/117* (2025.01); *H10D 64/01* (2025.01); *H10D 64/252* (2025.01); *H10P 52/00* (2026.01); *H10D 62/8325* (2025.01)

(58) Field of Classification Search
CPC .. H10D 62/8325; H10D 12/031; H10D 30/60; H10D 30/0291–0297; H10D 62/364; H10D 30/66–669; H10W 42/121; H10P 52/00; H10P 50/00
See application file for complete search history.

(56) References Cited

U.S. PATENT DOCUMENTS

| | | | | |
|---|---|---|---|---|
| 2021/0384189 | A1 | 12/2021 | Honda et al. | |
| 2023/0100252 | A1* | 3/2023 | Fukae .................... | H10D 1/714 257/534 |

FOREIGN PATENT DOCUMENTS

| | | | |
|---|---|---|---|
| JP | 2021-190639 | A | 12/2021 |
| WO | 2015/019734 | A1 | 2/2015 |
| WO | 2018/012510 | A1 | 1/2018 |

* cited by examiner

FIG. 1

F I G. 2
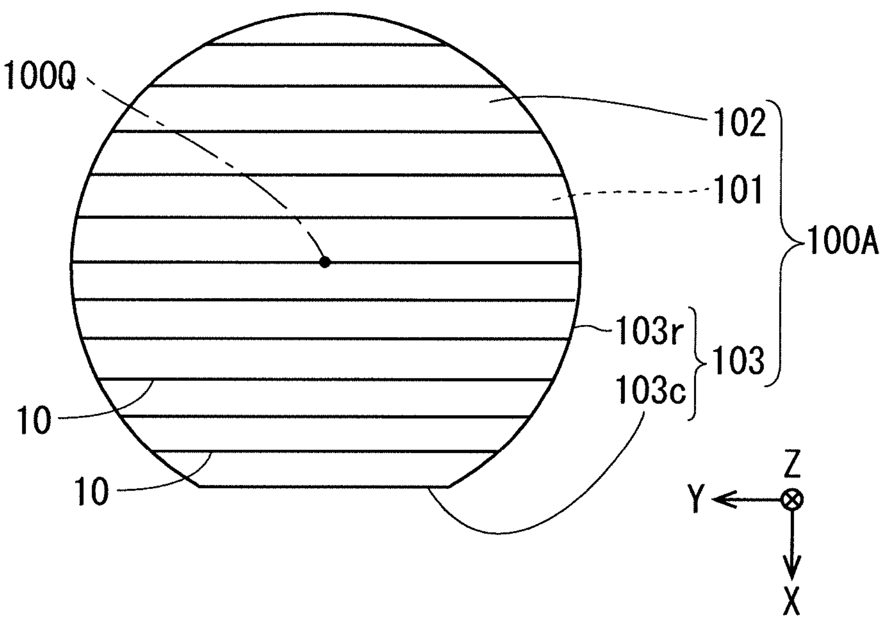

F I G. 6
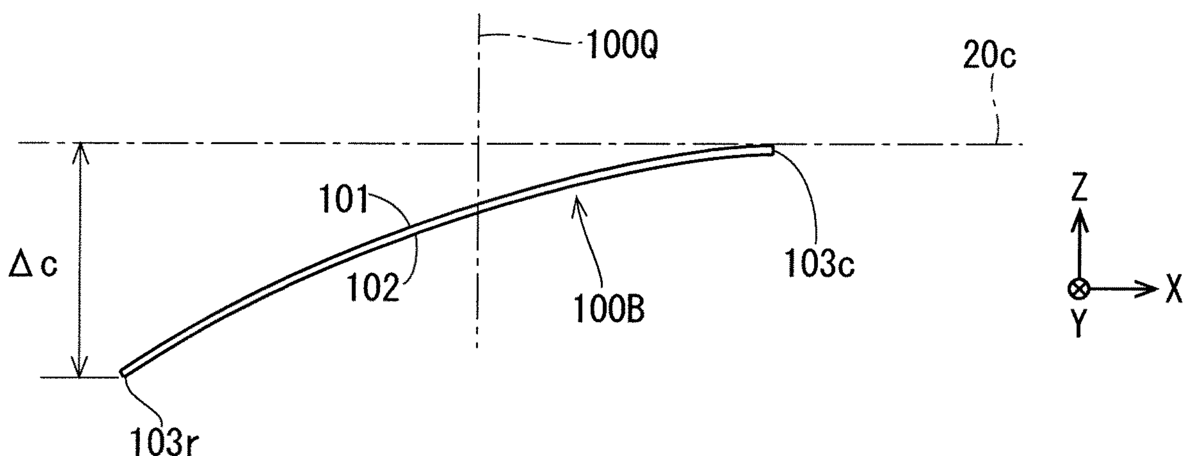

F I G. 7

F I G. 8
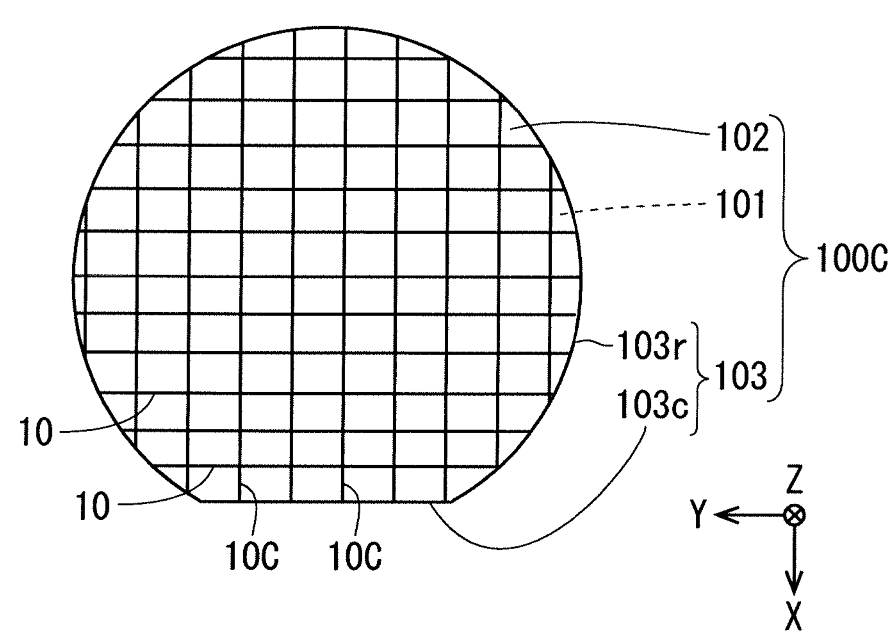

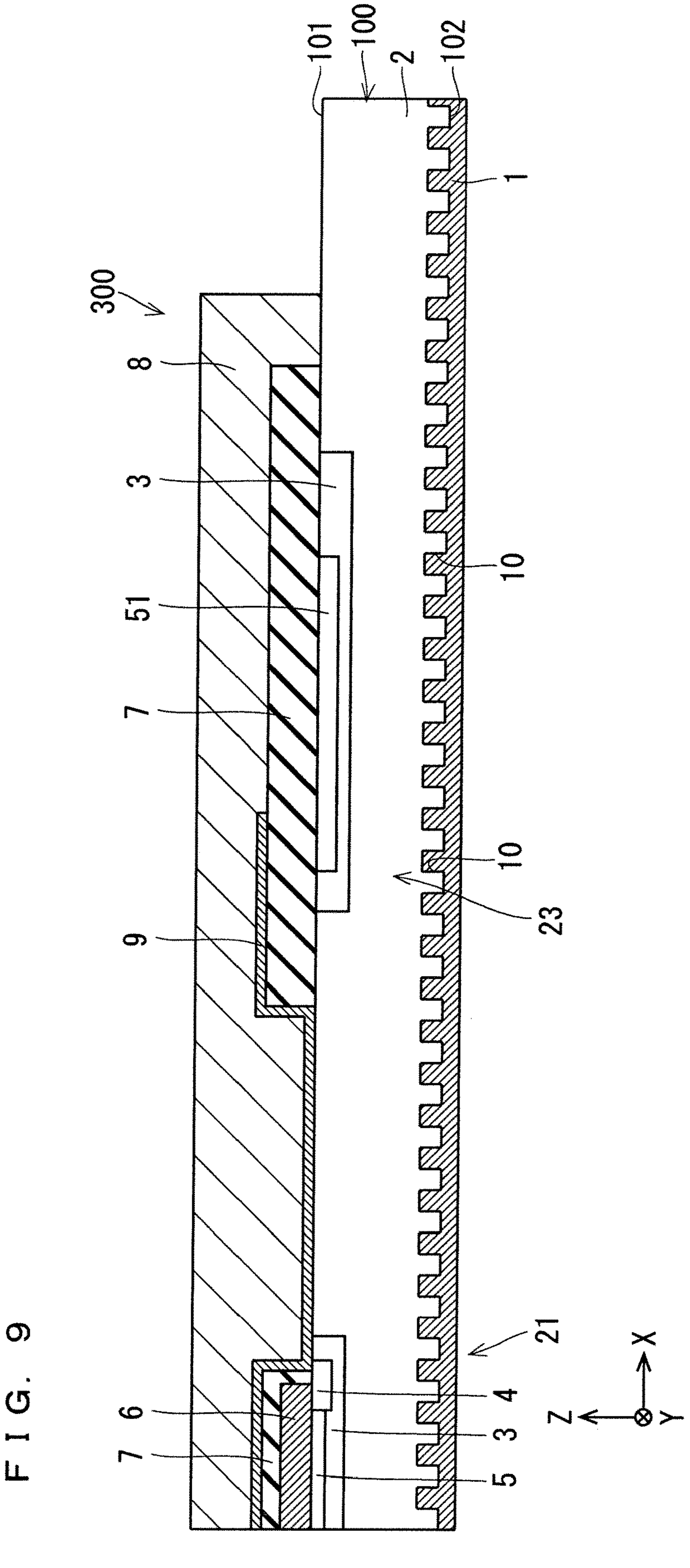
F I G. 9
300
8
3
51
7
9
6
7
101
100
2
102
1
10
10
23
21
4
3
5
Z
X
Y

F I G. 1 1
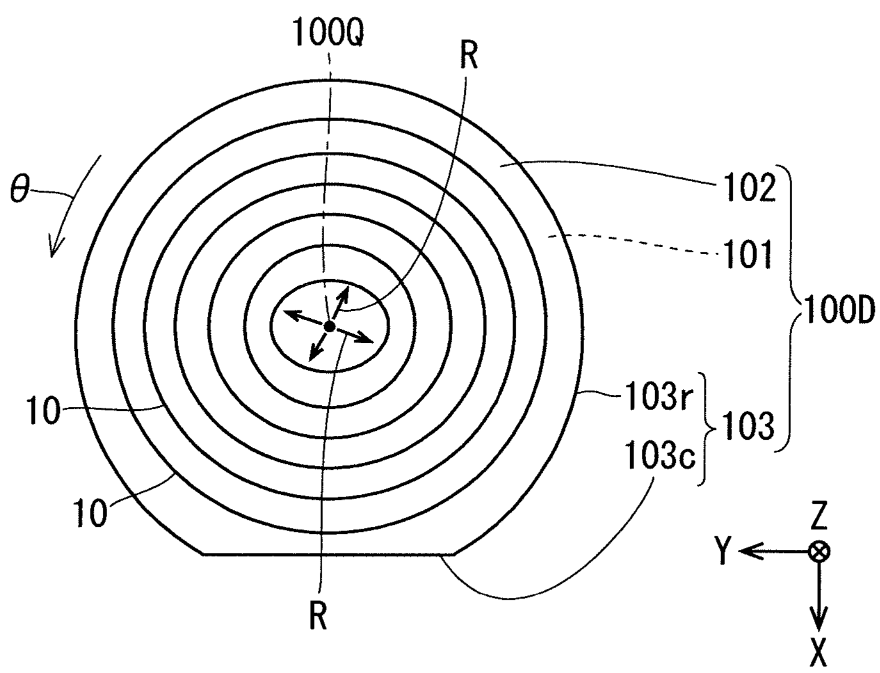

F I G. 1 4

F I G. 1 5

400B 8 3 100 2 102 1 4 22 7 13 S 4 9 10 10 7 4 13 S 22 4 101 X Z Y

F I G. 19
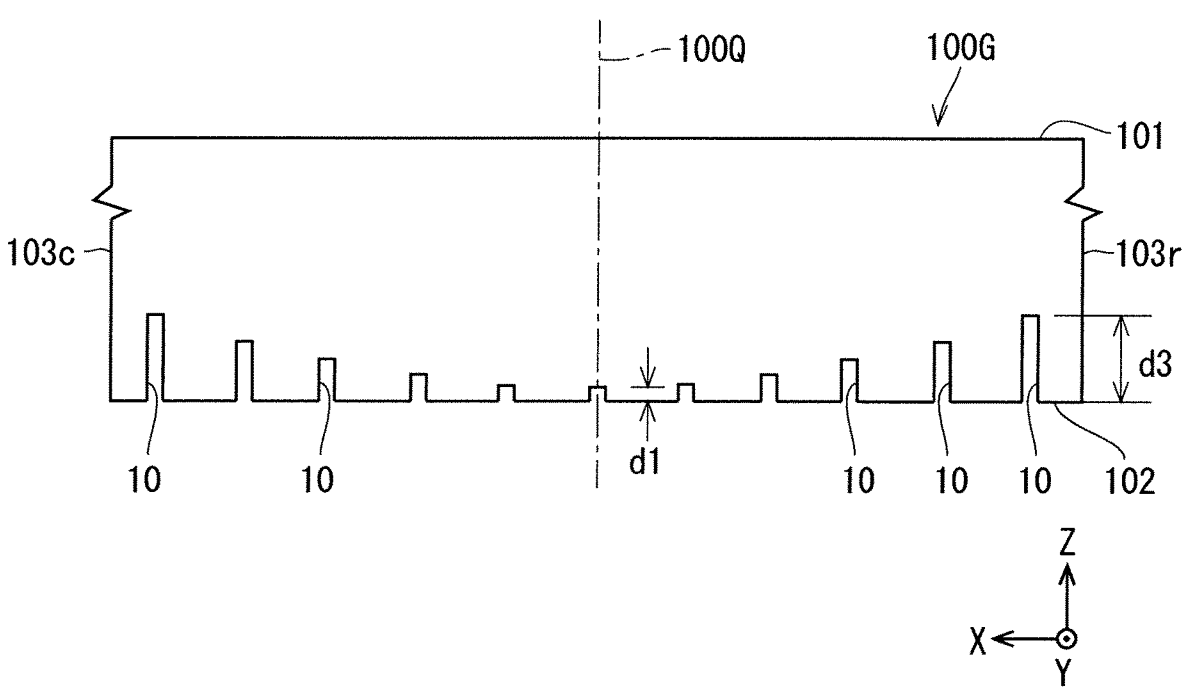

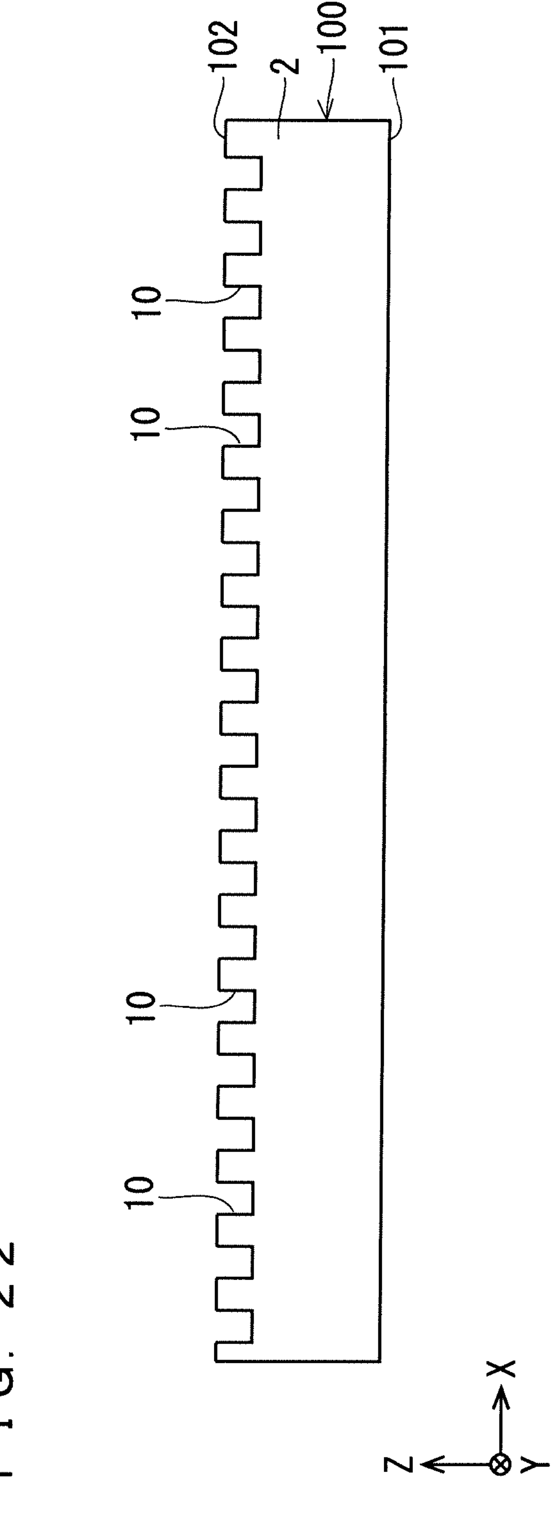
F I G. 2 2

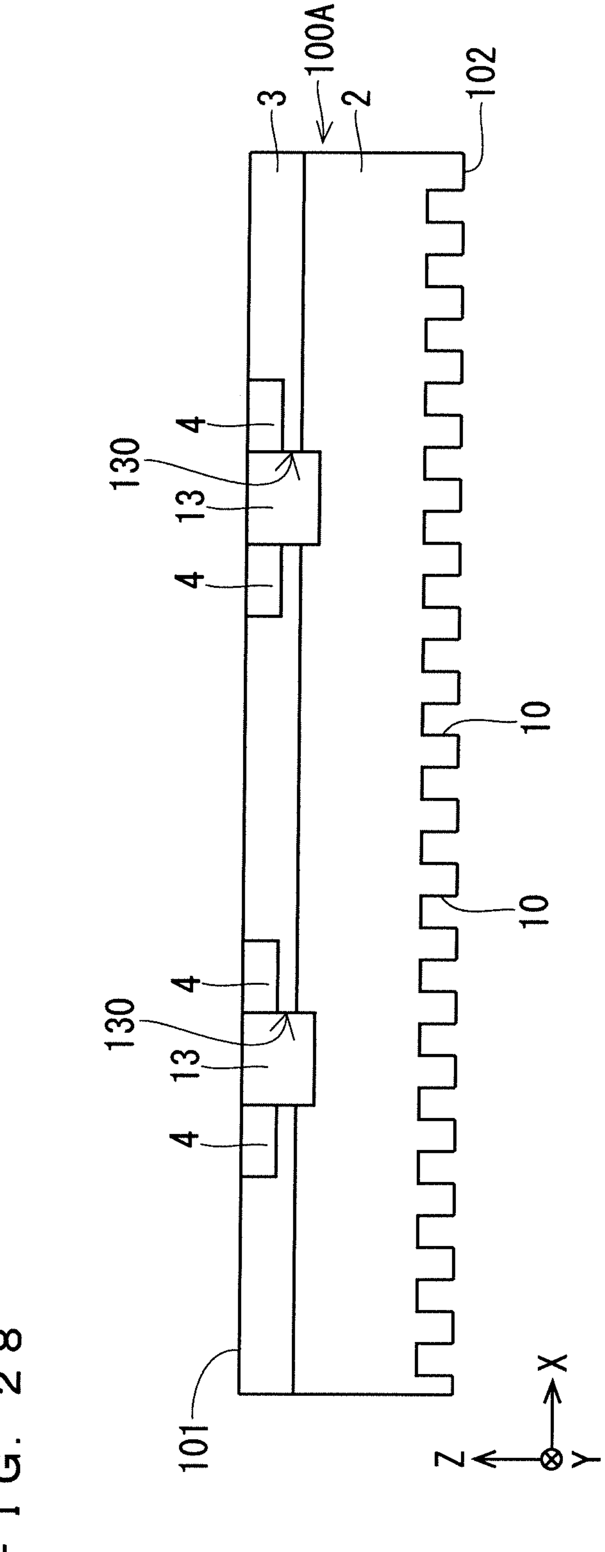
F I G. 2 8

SEMICONDUCTOR DEVICE COMPRISING A SEMICONDUCTOR SUBSTRATE AND A PLURALITY OF CONCAVE PORTIONS THAT EXTEND ALONG A DIRECTION PERPENDICULAR TO A DIRECTION IN WHICH THE SEMICONDUCTOR SUBSTRATE IS SUSCEPTIBLE TO WARPING MOST AND METHOD OF MANUFACTURING SEMICONDUCTOR DEVICE

BACKGROUND OF THE INVENTION

Field of the Invention

The present disclosure relates to a semiconductor device and a method of manufacturing the semiconductor device.

Description of the Background Art

A semiconductor device is manufactured by forming a semiconductor element on a semiconductor substrate. The semiconductor substrate has a thin plate shape and is commonly referred to as a wafer. Flatness is desirably required for the semiconductor substrate.

Japanese Patent Application Laid-Open No. 2006-156658 discloses a technique of reducing the substrate resistance with warping of the substrate being suppressed by forming a wall of mesh-like convex portions and a plurality of concave portions on the back surface of a semiconductor substrate. International Publication No. 2018/012510 discloses trenches that discretely define a semiconductor on one side of a semiconductor substrate. Japanese Patent Application Laid-Open No. 2021-190639 is related to the present disclosure.

The photolithography process is adopted when semiconductor elements are formed on a wafer. In the photolithography process, the surface of the wafer on which semiconductor elements are formed is desired to be flat. The surface curves due to various factors. When the curved wafer surface is subject to the photolithography process, the focus point deviates in the exposure. The deviation of the focus point is a factor that makes a difference between the dimensions of the resist to be patterned used in the photolithography process and the expected values of the dimensions. The difference is a factor that degrades the electrical characteristics of the manufactured semiconductor device. The larger the diameter of the wafer is, the greater the influence of the curvature on the deviation of the focus point becomes. From the viewpoint of improving the yield of semiconductor devices, a large wafer diameter is desirable.

Supposition is made that the step of forming trenches in a striped manner disclosed in International Publication No. 2018/012510 is more facilitated than the step of forming a wall of mesh-like convex portions disclosed in Japanese Patent Application Laid-Open No. 2006-156658. However, neither consideration as to warping nor mention as to which direction the trenches in a striped manner are aligned along is made in International Publication No. 2018/012510.

SUMMARY

An object of the present disclosure is to provide a semiconductor device with small warping.

According to a semiconductor device according to the present disclosure include a semiconductor substrate having a first surface, a second surface facing the first surface, and an outline, and an impurity region located on a side of the first surface in the semiconductor substrate. The second surface has a plurality of concave portions, and each of the plurality of concave portions open toward a side opposite to the first surface and extend along a direction perpendicular to a direction in which the semiconductor substrate is susceptible to warping most.

A method of manufacturing a semiconductor device according to the present disclosure includes a first step, a second step, and a third step. In the first step, to a semiconductor substrate having a first surface and a second surface facing the first surface, in the second surface, a plurality of concave portions each of which is open to an opposite side to the first surface are formed. In the second step, an impurity region is formed in the first surface, following the first step. In the third step, an electrode is formed on the second surface, following the second step.

The semiconductor device of the present disclosure has small warping. The method of manufacturing a semiconductor device according to the present disclosure manufactures a semiconductor device with small warping.

These and other objects, features, aspects and advantages of the present disclosure will become more apparent from the following detailed description of the present disclosure when taken in conjunction with the accompanying drawings.

BRIEF DESCRIPTION OF THE DRAWINGS

Figure 1:
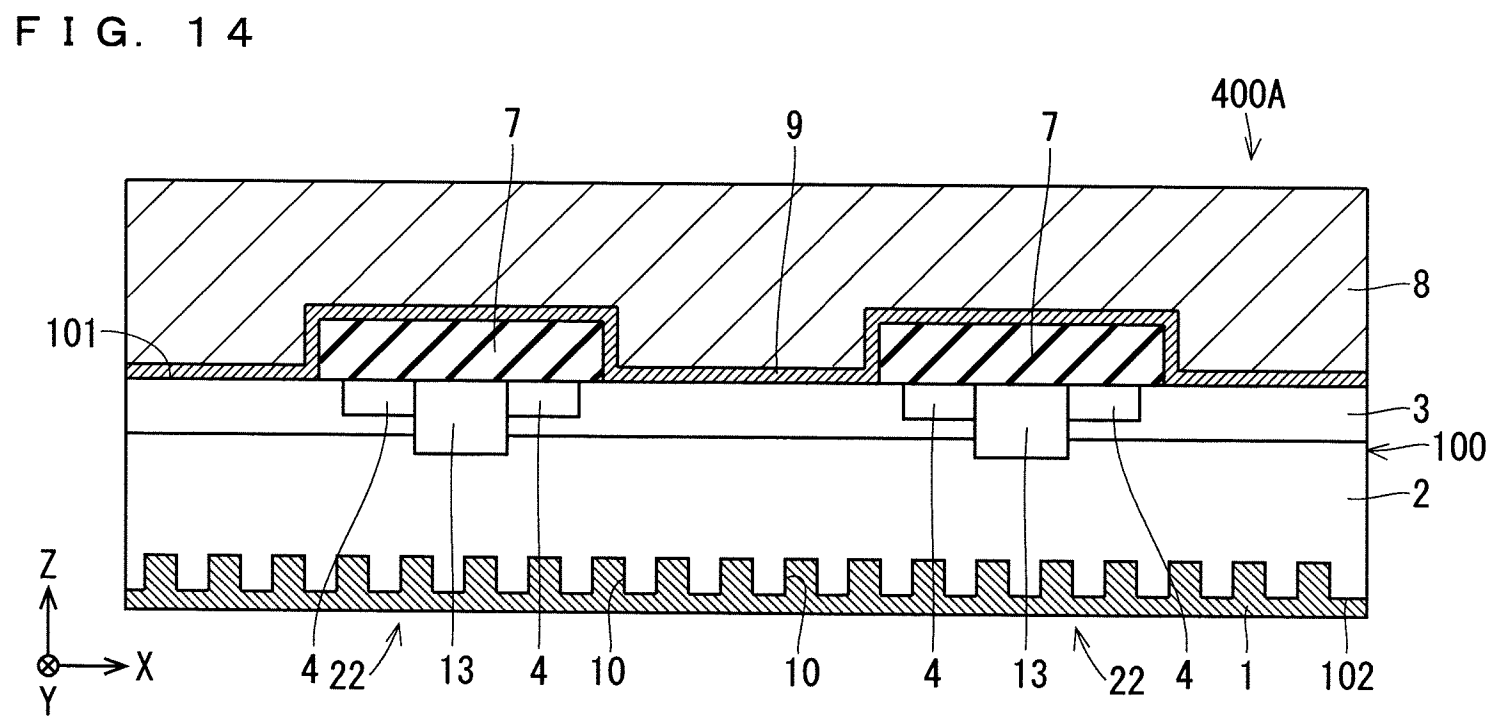
Figure 1:
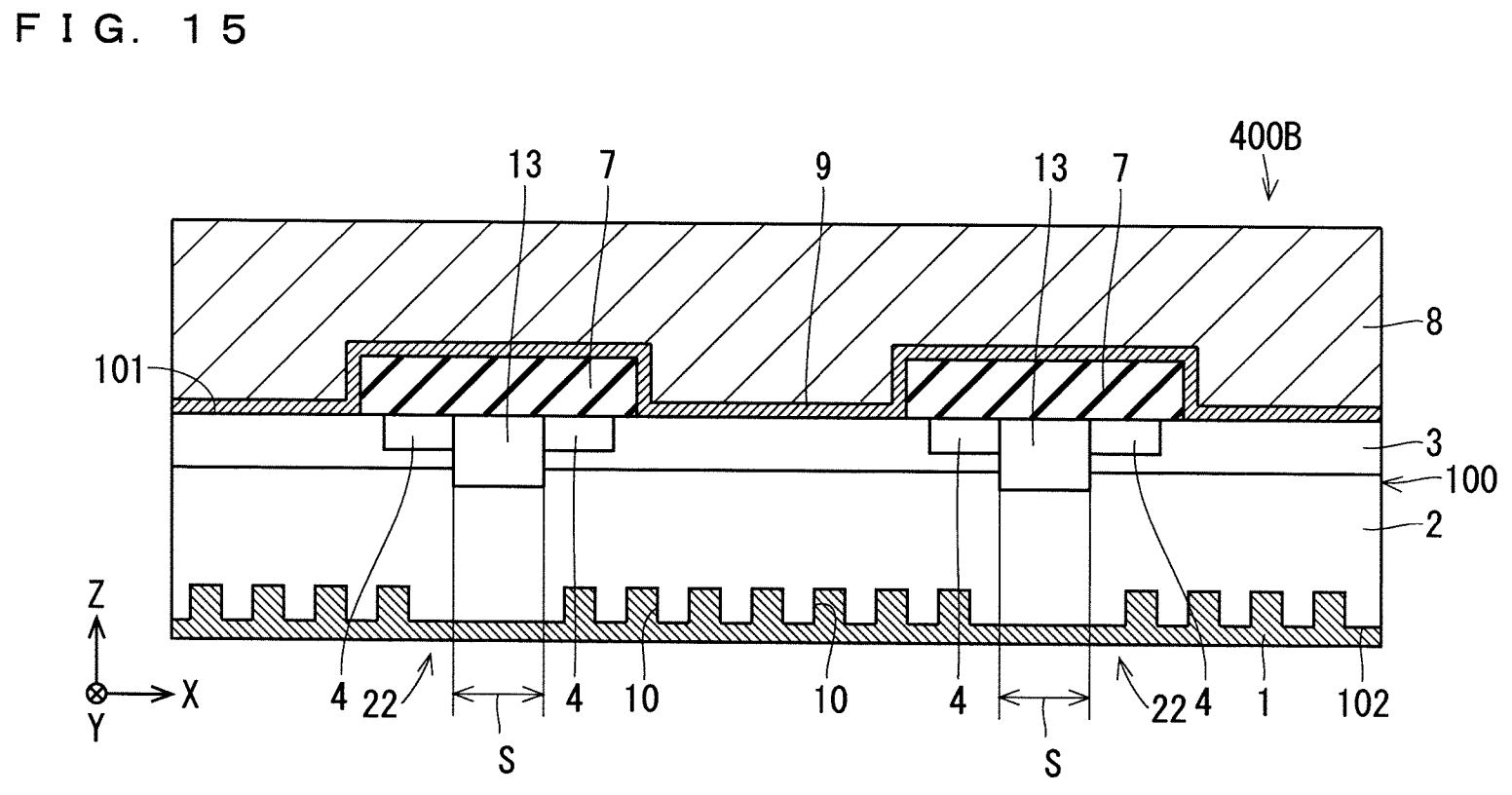

FIG. 1 is a cross-sectional view illustrating a semiconductor device according to a first embodiment;

FIG. 2 is a plan view illustrating a semiconductor substrate;

FIG. 6 is a cross-sectional view taken along the line CC of FIG. 3;

FIG. 7 is a cross-sectional view illustrating a semiconductor device subject to comparison with the first embodiment;

FIG. 8 is a plan view illustrating another example of grooves;

FIG. 9 is a cross-sectional view illustrating the vicinity of the terminal portion;

FIG. 11 is a plan view illustrating a semiconductor substrate according to a second embodiment;

FIG. 14 is a cross-sectional view illustrating a semiconductor device according to a third embodiment;

FIG. 15 is a cross-sectional view illustrating another semiconductor device according to the third embodiment;

FIGS. 18 and 19 are cross-sectional views illustrating a semiconductor substrate according to a fifth embodiment;

FIGS. 21 and 22 are cross-sectional views for illustrating a first step;

FIGS. 23 to 25 are cross-sectional views for illustrating a second step;

FIG. 26 is a cross-sectional view for illustrating the second step and a third step;

FIGS. 27 to 29 are cross-sectional views for illustrating the second step.

DESCRIPTION OF THE PREFERRED EMBODIMENTS

First Embodiment

Figure 1:
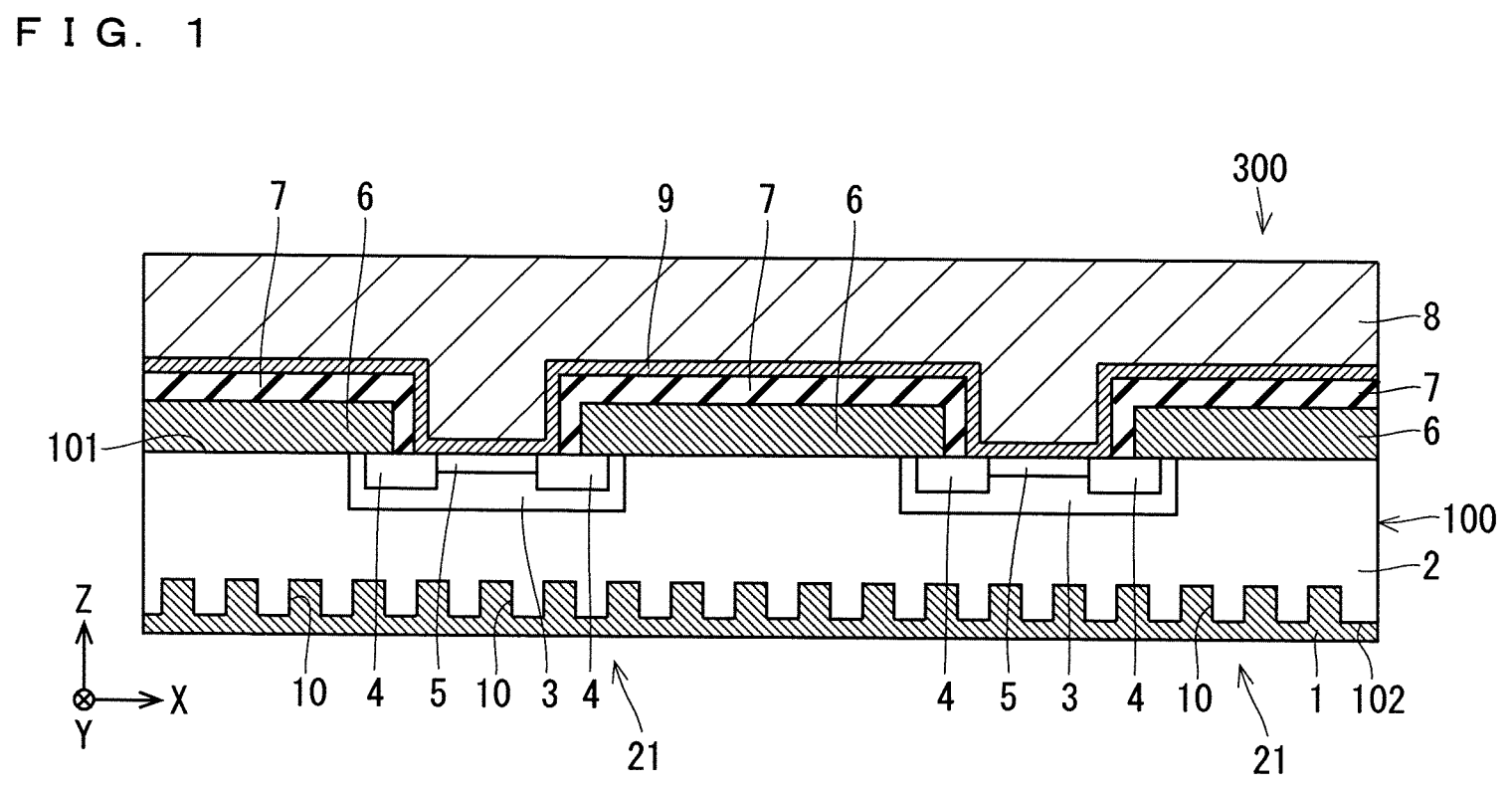
Figure 3:
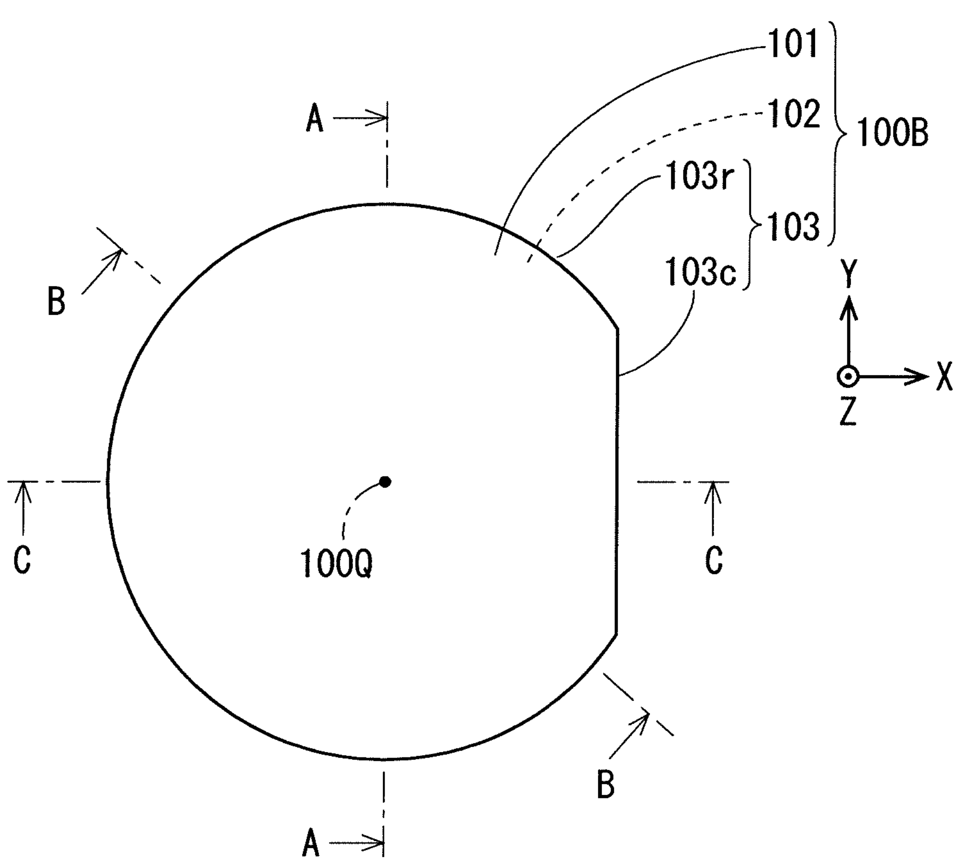
FIG. 3 is a plan view illustrating the semiconductor substrate.

FIG. 1 is a cross-sectional view illustrating a semiconductor device 300 according to a first embodiment of the present disclosure. The semiconductor device 300 includes a semiconductor substrate 100 and a semiconductor element 21. The semiconductor element 21 is formed in the semiconductor substrate 100.

The semiconductor substrate 100 has a surface 101 and a surface 102. The surface 102 faces to the surface 101. In the following description, for the sake of convenience, the Z-axis is set which represents the direction from the surface 102 toward the surface 101 as the positive direction. A right-handed XYZ coordinate system is set for the Z axis. FIG. 1 is a cross-sectional view of a semiconductor device 300 viewed along the positive direction of the Y-axis (hereinafter "direction Y").

Silicon, for example, is adopted as the material of the semiconductor substrate 100. Silicon carbide, for example, is adopted as the material of the semiconductor substrate 100. For example, the semiconductor substrate 100 is a silicon carbide substrate composed of an epitaxial layer. Silicon carbide is a so-called wide-gap semiconductor.

The surface 102 has a plurality of grooves 10. It can be said that the grooves 10 are concave portions opening on the side opposite to the surface 101. FIG. 1 illustrates a case where the grooves 10 extend along the direction Y and are in alignment along the positive direction of the X-axis (hereinafter "direction X").

In FIG. 1, the semiconductor element 21 is illustrated as a field effect transistor having a Metal Oxide Semiconductor (MOS) structure. Specifically, the semiconductor element 21 includes a drain electrode 1, a semiconductor layer 2, well regions 3, source regions 4, a gate electrode 6, and a source electrode 8. In FIG. 1, the case is illustrated where the semiconductor element 21 further includes contact regions 5, an interlayer insulating film 7, and a barrier metal 9.

The conductivity type of the semiconductor substrate 100 at the surface 101 and that at the surface 102 coincide with each other. The semiconductor substrate 100 serves as the semiconductor layer 2. The semiconductor layer 2 is, for example, an n-type epitaxial layer. The impurity concentration of the semiconductor layer 2 is appropriately selected in consideration of the breakdown voltage required for the semiconductor device 300, for example.

The well regions 3 are, for example, p-type impurity regions. The source regions 4 are, for example, n-type impurity regions. The contact regions 5 are, for example, $p^+$-type impurity regions.

The well regions 3 are selectively located on the surface 101 side in the semiconductor layer 2. In terms of the source regions 4, a pair of the source regions 4 is selectively positioned for each well region 3 on the surface 101 side in section view.

The contact region 5 is interposed between a pair of source regions 4 facing each other in the direction X and surrounded by the well region 3 in FIG. 1. The contact regions 5 are adjacent to the source electrode 8 via the barrier metal 9 in the positive direction of the Z-axis (hereinafter "direction Z"). The contact regions 5 may be omitted.

The gate electrode 6 is adjacent to the semiconductor layer 2, the well regions 3, and the source regions 4 from the side opposite to the surface 102 via a gate oxide film (not illustrated).

The interlayer insulating film 7 covers the gate electrode 6 from the side opposite to the surface 102. The interlayer insulating film 7 is adjacent to the source electrode 8 with the barrier metal 9 interposed therebetween. For example, tetraethyl orthosilicate (TEOS) or borophosphosilicate glass (BPSG) is adopted as the material of the interlayer insulating film 7.

The drain electrode 1 is placed in contact with the surface 102 from the side opposite the surface 101. FIG. 1 illustrates a case where the drain electrode 1 is also located in the grooves 10.

FIG. 2 is a plan view illustrating a semiconductor substrate 100A employed as the semiconductor substrate 100. FIG. 2 is a plan view viewed along a direction opposite to the direction Z. The surface 101 is located more on the direction Z side than the surface 102 is; therefore, a dashed line is adopted for the leader line indicating the surface 101 in FIG. 2.

The semiconductor substrate 100A has an outline 103. The outline 103 has a curve 103*r* and an orientation flat 103*c* in plan view. The curve 103*r* exhibits a substantially circular arc. A central axis 100Q of the circular arc is illustrated. The orientation flat 103*c* in FIG. 2 indicates a straight line parallel to the Y-axis. Whether a groove 10 passes through the central axis 100Q does not matter.

The orientation flat 103*c* is formed parallel to the <11-20> axis of crystal orientation, when the semiconductor substrate 100A is a silicon carbide substrate, for example. However, the relationship between the direction of the orientation flat 103*c* and the crystal orientation is not indispensable for obtaining the effects described later.

In FIG. 2, consistent with FIG. 1, the case where grooves 10 extend along the direction Y and are in alignment along the X direction. However, in FIG. 2, in comparison with what is illustrated in FIG. 1, the number of grooves 10 is omitted. The greater the number of the grooves 10, the greater the effect of reducing the warping of the semiconductor substrate 100A and thus of the semiconductor device 300 becomes, which effect will be described later. The fewer the number of the grooves 10, the higher the rigidity of the semiconductor substrate 100A and thus of the semiconductor device 300 becomes.

The width of the groove 10 is, for example, about several μm to several mm. The width of groove 10 may either widen or narrow as it goes away from the surface 101. A case where the width of groove 10 widens as it goes away from surface 101 will be described later as a modification of the present embodiment.

Each of intervals between the grooves 10 is, for example, several μm to several mm. The intervals between the grooves 10 may or may not be equal. A case where the intervals between the grooves 10 are not equal will be described in the fourth embodiment.

The depth of the groove 10 is, for example, 1 μm to 10 μm. The deeper the groove 10 is, the higher the effect of reducing warping becomes, which will be described later. The shallower the groove 10 is, the higher the rigidity of the semiconductor substrate 100A and thus of the semiconductor device 300 becomes.

The depths of the grooves 10 may be the same or different. A case where the depths of the grooves 10 are different will be described in the fifth embodiment.

If no grooves 10 are provided on the semiconductor substrate 100, the semiconductor substrate 100 curves due to various factors. For example, ion implantation and thermal oxidation, which will be described later, performed when forming the semiconductor element 21 can cause the semiconductor substrate 100 to be curved. The curving of the semiconductor substrate 100 is reduced by using the semiconductor substrate 100A having the grooves 10. The grooves 10 preferably extend in a direction having a specific relationship with the direction in which the semiconductor substrate 100 tends to warp. Before describing the specific relationship, the description is made below in terms of the direction of the tendency to warp.

FIG. 3 is a plan view illustrating a semiconductor substrate 100B. The semiconductor substrate 100B differs from the semiconductor substrate 100A in that the surface 102 does not have the grooves 10. FIG. 3 is a plan view viewed along the direction Z. The surface 102 is located on the opposite side to the direction Z more than the surface 101 is; therefore, a dashed line is adopted for the leader line indicating the surface 102 in FIG. 3.

Figure 4:
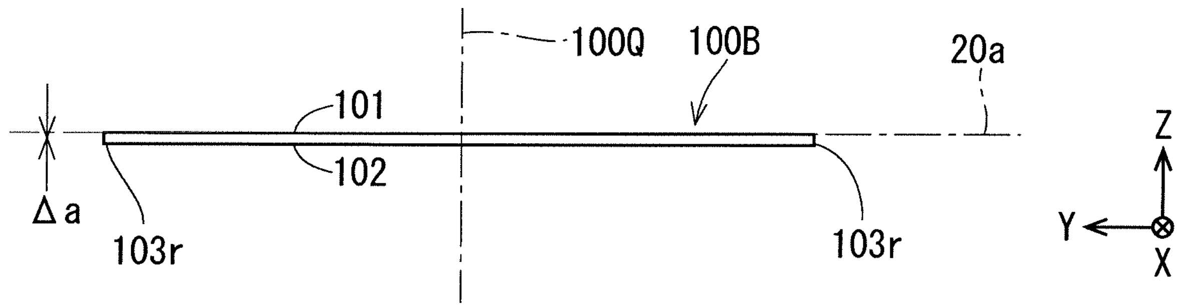
FIG. 4 is a cross-sectional view taken along the line AA of FIG. 3.
Figure 5:
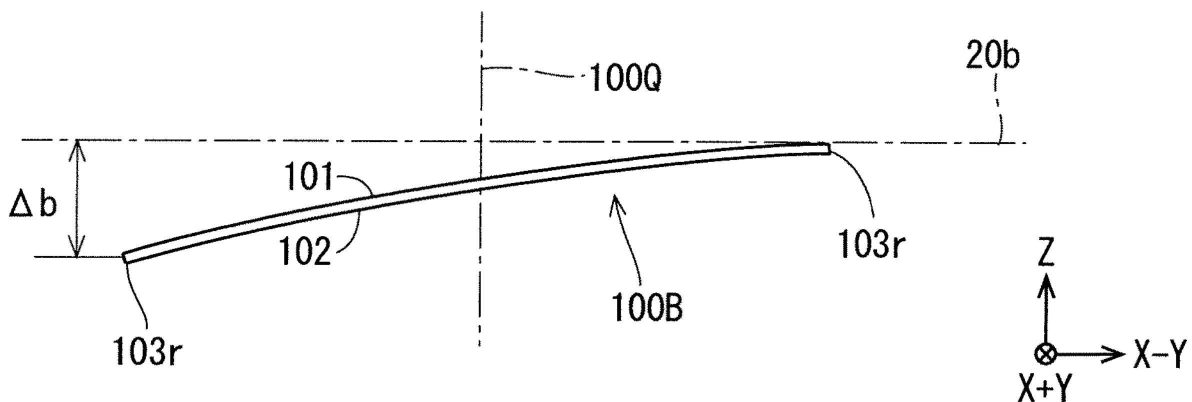
FIG. 5 is a cross-sectional view taken along the line BB of FIG. 3.

FIG. 4 is a cross-sectional view taken along the line AA of FIG. 3. FIG. 4 illustrates a cross section including the central axis 100Q of the semiconductor substrate 100B viewed along the direction X. FIG. 5 is a cross-sectional view taken along the line BB of FIG. 3. FIG. 5 illustrates a cross section including the central axis 100Q of the semiconductor substrate 100B viewed along the direction (X+Y). Here, the "direction (X+Y)" is a tentative name for a direction forming 45 degrees to the direction X as well as to the direction Y when viewed along the direction Z. In FIG. 5, "(X−Y)" indicates the (X−Y) direction. Here, the "direction (X−Y)" is a tentative name for a direction forming 45 degrees to the direction X and forming 135 degrees to the direction Y when viewed along the direction Z. FIG. 6 is a cross-sectional view taken along the line CC of FIG. 3. FIG. 6 illustrates a cross section including the central axis 100Q of the semiconductor substrate 100B viewed along the direction Y.

In FIG. 3 to FIG. 6, the direction Z when the semiconductor substrate 100B is not curved is adopted. FIG. 3 to FIG. 6 illustrate the curvature of the surface 101 being convex along the direction perpendicular to the orientation flat 103*c*.

In FIG. 4, a position 20*a* indicates the position of the semiconductor substrate 100B on the direction Z side farthest in section view. A distance Δa is a distance along the direction Z between the position on the farthest side opposite to the direction Z side and the position 20*a* in section view.

In FIG. 5, a position 20*b* indicates the position of the semiconductor substrate 100B on the direction Z side farthest in section view. A distance Δb is a distance along the direction Z between the position on the farthest side opposite to the direction Z side and the position 20*b* in section view.

In FIG. 6, a position 20*c* indicates the position of the semiconductor substrate 100B on the direction Z side farthest in section view. A distance Δc is a distance along the direction Z between the position on the farthest side opposite to the direction Z side and the position 20*c* in section view.

The distances Δa, Δb, and Δc are quantitative indices of the warping of the semiconductor substrate 100B. In the examples illustrated in FIG. 3 to FIG. 6, $\Delta a<\Delta b<\Delta c$ is established, and the semiconductor substrate 100B has almost no warping along the direction Y and warps most along the direction X. It can be said that the semiconductor substrate 100B is most likely to warp along the direction X.

Such warping of the semiconductor substrate 100B is caused, for example, by a method of holding the semiconductor substrate 100B. Regardless of any of the semiconductor substrate 100A and 100B, the semiconductor substrate 100 is often stored with the orientation flat 103*c* facing vertically upward or vertically downward. When taking out the semiconductor substrate 100 stored in this manner from the stored position, for example, air tweezers are used.

When the semiconductor substrate 100 is stored with the orientation flat 103*c* facing vertically upward, the air tweezers clamp the vicinity of the orientation flat 103*c* and hold the semiconductor substrate 100 horizontally. By holding in this manner, the farther away a portion in the semiconductor substrate 100B from the orientation flat 103*c* is, the lower it directs vertically downward due to its own weight. The semiconductor substrate 100 is susceptible to warping greatly in the vicinity of the curve 103*r* on the side opposite to the orientation flat 103*c* due to the holding in such a manner.

When the semiconductor substrate 100 is stored with the orientation flat 103*c* facing vertically downward, the air tweezers clamp the vicinity of the curve 103*r* on the side opposite to the orientation flat 103*c* and hold the semiconductor substrate 100 horizontally. By holding in this manner, the closer a portion in the semiconductor substrate 100B to the orientation flat 103*c* is, the lower it directs vertically downward due to its own weight. The semiconductor substrate 100 is susceptible to warping greatly in the vicinity of the orientation flat 103*c* due to the holding in such a manner.

As can be understood from the examples adopting the semiconductor substrate 100B in FIG. 4 to FIG. 6, for example, the vicinity of the orientation flat 103*c* of the semiconductor substrate 100 is clamped with the air tweezers, and when the surface 101 is held facing upward, the semiconductor substrate 100 is susceptible to warping with the surface 101 convex.

When the vicinity of the orientation flat 103*c* of the semiconductor substrate 100 is clamped with the air tweezers and held with the surface 102 facing upward, the semiconductor substrate 100 is susceptible to warping with the surface 102 convex.

By holding the semiconductor substrate 100 in this manner, the semiconductor substrate 100 is susceptible to warping in the direction perpendicular to the orientation flat 103*c* regardless of whether the surface 101 is to be convex or the surface 102 is to be convex. It can be said that the direction in which the semiconductor substrate 100 is susceptible to warping is the direction perpendicular to the orientation flat 103*c*. The susceptibility of the semiconductor substrate 100 to warping in this manner tends to become more apparent as the diameter of the semiconductor substrate 100 increases.

In the case where the material of the semiconductor substrate 100 is silicon carbide, the warping tends to occur with the influence of the precision when cutting silicon carbide as a wafer, the residual strain during processing and polishing of the front and back surfaces, and the internal stress of silicon carbide crystals.

As illustrated in FIG. 2, the grooves 10 the semiconductor substrate 100A has extend parallel to the orientation flat 103*c*. The grooves 10 are aligned along a direction perpendicular to the orientation flat 103*c*. When the semiconductor substrate 100 is susceptible to warping in the direction perpendicular to the orientation flat 103*c*, due to each of the grooves 10, the warping of the semiconductor substrate 100 is reduced by using the semiconductor substrate 100A as the semiconductor substrate 100. The grooves 10 reduce the warping of the semiconductor substrate 100 regardless of which of the surfaces 101 and 102 is warped convexly.

Figure 7:
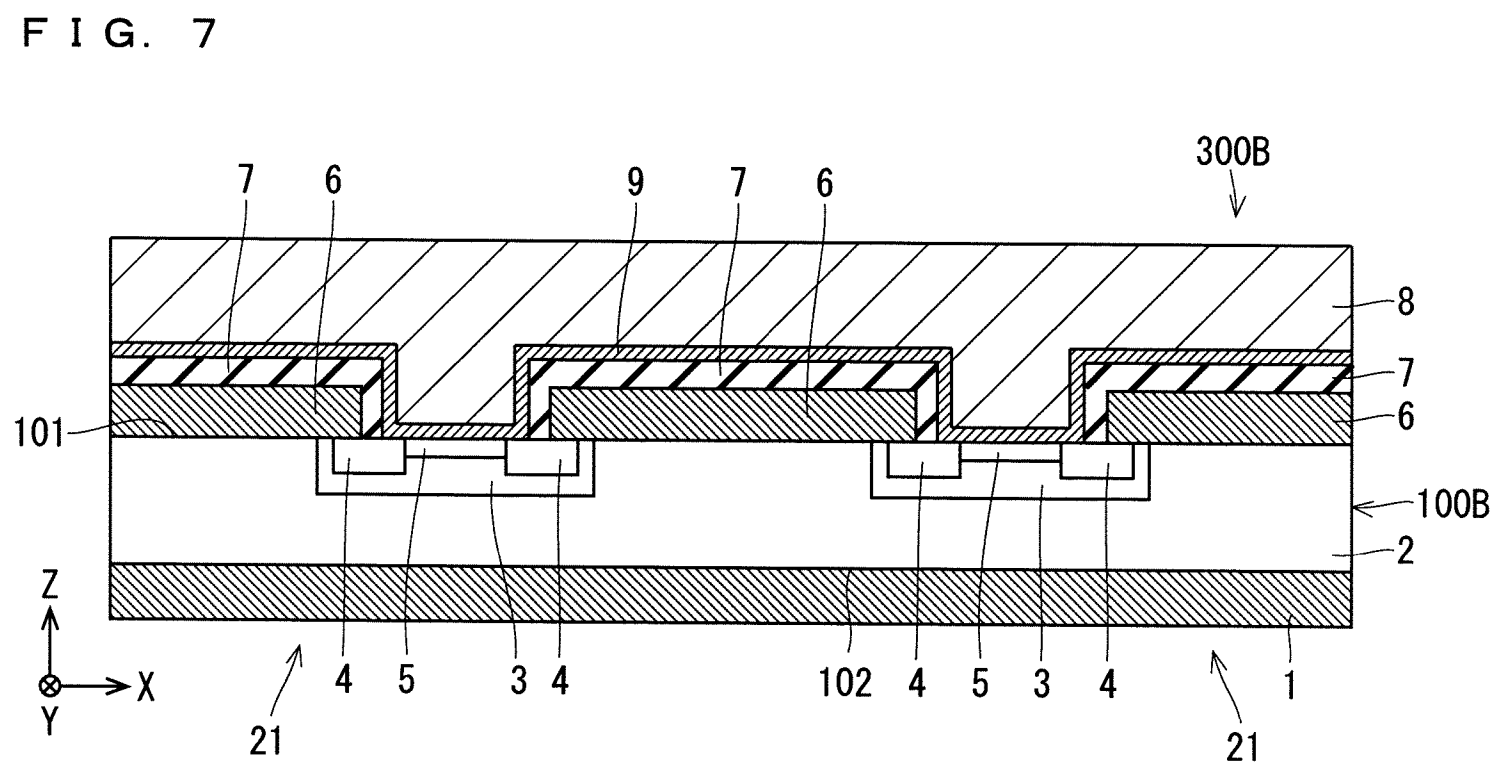

FIG. 7 is a cross-sectional view illustrating a semiconductor device 300B subject to comparison with the first embodiment of the present disclosure. FIG. 7 is a cross-sectional view of the semiconductor device 300 viewed along the direction Y.

A semiconductor device 300B differs from the semiconductor device 300 in that a semiconductor substrate 100B is adopted instead of the semiconductor substrate 100. The semiconductor device 300B differs from the semiconductor device 300 in that no grooves 10 is provided on the surface 102.

The semiconductor substrate 100 used in the semiconductor device 300 is less likely to warp than the semiconductor substrate 100B used in the semiconductor device 300B. One or both of the well regions 3 and the source regions 4 in the semiconductor device 300B are common in that they are impurity regions formed in the plane 101. From this point of view, the term "surface impurity region" will be adopted hereinafter as a term indicating "one or both of the well regions 3 and the source regions 4". The surface impurity region tends to be formed wider than intended due to, for example, deviation of focus point in photolithography process. The surface impurity region being formed differently from the intended range is a factor of the electrical characteristics including the voltage threshold characteristics of the field effect transistor the semiconductor element 21 implements being different from the intended values and occurrence of defects.

In comparison with the semiconductor substrate 100B without the grooves 10, in the semiconductor substrate 100 with the grooves 10 on the surface 102, the deviation of focus point is small in the photolithography process for forming the surface impurity region in the surface 101. Such smallness of the deviation reduces the extent to which the electrical characteristics of the field effect transistor the semiconductor element 21 implements being different from the intended values and the extent of occurrence of defects.

The grooves 10 of the surface 102 serve to reduce the warping of the semiconductor substrate 100 and thus of the semiconductor device 300 using the semiconductor substrate 100. Reduction in the warping of the semiconductor device 300 reduces variations in the extent to which the surface impurity region spreads. Reduction in the variation in the range reduces the variation in the characteristics of the semiconductor device 21 including the surface impurity region.

FIG. 8 is a plan view illustrating another example of grooves 10. FIG. 8 is a plan view of a semiconductor substrate 100C viewed along the direction Z.

In FIG. 8, the semiconductor substrate 100C differs from the semiconductor substrate 100A in that not only the grooves 10 extending in the direction parallel to the orientation flat 103*c* but also grooves 10C extending in the direction perpendicular to the orientation flat 103*c* are provided.

The semiconductor substrate 100C can be applied to the semiconductor substrate 100. When semiconductor substrate 100 is susceptible to warping most in the direction perpendicular to the orientation flat 103*c*, the grooves 10C may possibly serve to increase the warping of semiconductor substrate 100. In terms of reducing such possibility and simplifying the process of forming the grooves 10, the semiconductor substrate 100A is more suitable for application as the semiconductor substrate 100 than the semiconductor substrate 100C.

For example, the grooves 10 also exist at positions distant from the semiconductor element 21. FIG. 9 is a cross-sectional view illustrating the vicinity of a terminal portion 23 of the semiconductor device 300.

The terminal portion 23 includes the semiconductor layer 2, the well region 3, a guard ring 51, and the source electrode 8. The well region 3 is selectively located on the surface 101 side in the semiconductor layer 2. The guard ring 51 is selectively located in the surface 101 in the well region 3. The guard ring 51 is, for example, $p^+$-type impurity region. The well region 3 and the guard ring 51 are covered with the interlayer insulating film 7 from the side opposite to the surface 102. The interlayer insulating film 7 is interposed between, the source electrode 8 and the barrier metal 9, and, the well region 3 and the guard ring 51.

The grooves 10 serve to reduce the warping of the semiconductor substrate 100 and thus of the semiconductor device 300 in the vicinity of the terminal portion 23.

Figure 10:
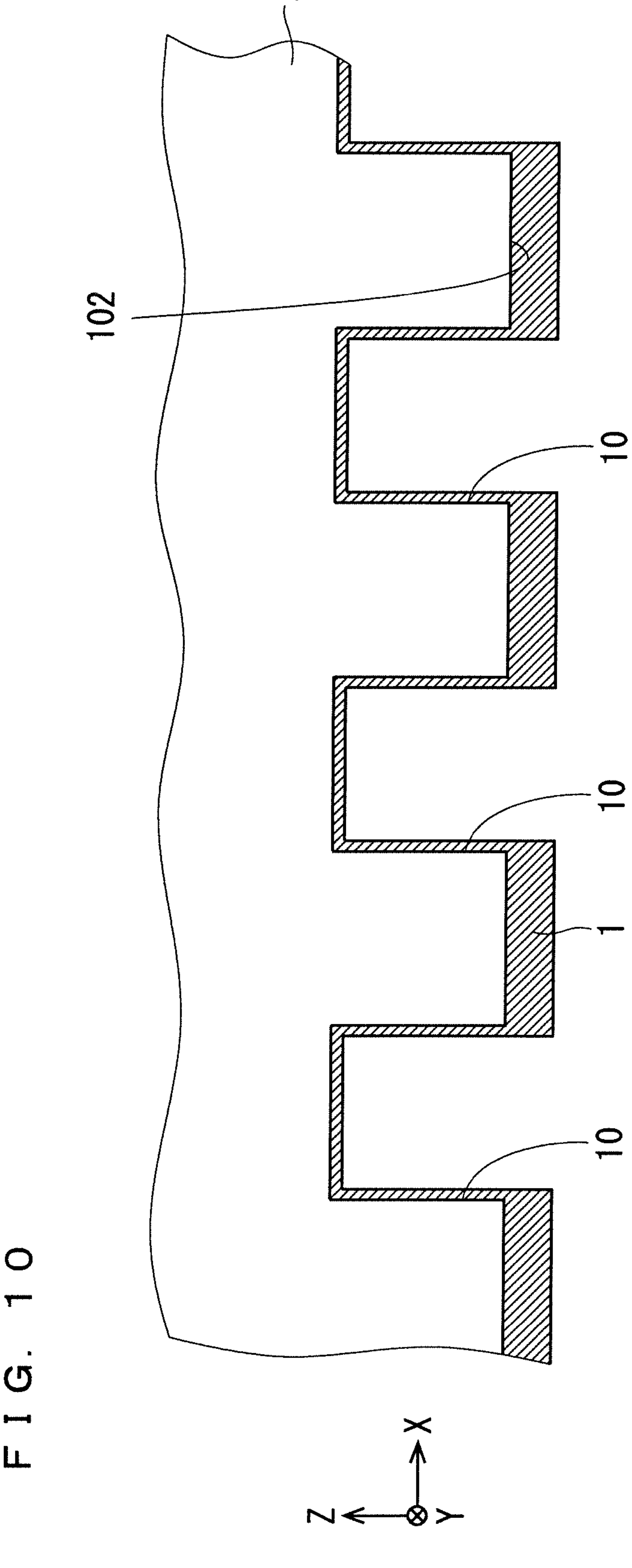
FIG. 10 is a cross-sectional view illustrating a modification of the positional relationship between the grooves and the drain electrode.

FIG. 10 is a cross-sectional view illustrating a modification of the positional relationship between the grooves 10 and the drain electrode 1. FIG. 10 is a cross-sectional view viewed along the direction Y. In the modification, the drain electrode 1 does not fill the grooves 10. In the modification, the drain electrode 1 exhibits a corrugating pattern reflecting the shape of the grooves 10. The corrugating pattern of the drain electrode 1 improves the heat dissipation of the semiconductor device 300 diced into a chip. Specifically, for heat dissipation of the semiconductor device 300 diced into a chip, die bonding of the drain electrode 1 to an element for heat dissipation, for example, a heat sink is adopted. A bonding material used for die bonding, such as solder, enters the concave portions of the drain electrode 1 to improve adhesion between the heat sink and the drain electrode 1. Such improvement in adhesion improves heat dissipation.

The width of the grooves 10 widens as the distance from the surface 101 increases so that the solder can easily enter the concave portions of the drain electrode 1. No drain electrode 1 may be provided at all in the grooves 10.

The description of the above modifications can be applied to all the following embodiments.

Second Embodiment

The step of forming the impurity region in the semiconductor substrate 100 can also be a cause for the warping of the semiconductor substrate 100. For example, the well regions 3, the source regions 4 and the contact regions 5 are formed using photolithography process and ion implantation. Photolithography process and ion implantation are applied to the semiconductor substrate 100 from the surface 101 side. The ion implantation disorders the atomic arrangement of the material of the semiconductor substrate 100, such as silicon carbide. The disordered atomic arrangement can be a cause for expansion of the surface 101 and thus warping the semiconductor substrate 100 with the surface 101 convex.

The interlayer insulating film 7 is formed by heat-treating the semiconductor substrate 100. The thermal expansion coefficient of silicon oxide is smaller than the thermal expansion coefficient of silicon and that of silicon carbide. The amount of shrinkage of the interlayer insulating film 7 formed at a high temperature at room temperature is smaller than the amount of shrinkage of the semiconductor substrate 100 exposed to a high temperature during formation of interlayer insulating film 7 at room temperature. The interlayer insulating film 7 is formed on the surface 101 side of the semiconductor substrate 100. The above-described difference in the amount of shrinkage can be a cause for the warping of the semiconductor substrate 100 with the surface 101 convex.

A metal film having a thickness of about several μm being formed on the semiconductor substrate 100 from the surface 101 side can also be a cause for the warping of the semiconductor substrate 100 with the surface 101 convex.

Due to these causes, the semiconductor substrate 100 is susceptible to warping in a dome shape with the surface 101 convex about the central axis 100Q. It can be said that the semiconductor substrate 100 is susceptible to warping with the surface 101 becoming convex along the direction away from the central axis 100Q, that is, along the so-called radial direction.

FIG. 11 is a plan view illustrating a semiconductor substrate 100D according to the second embodiment. FIG. 11 is a plan view viewed along the direction Z. The surface 101 is located more on the direction Z side than the surface 102 is; therefore, a dashed line is adopted for the leader line indicating the surface 102 in FIG. 11. As for the outline 103 and the central axis 100Q, the description for the semiconductor substrate 100A also applies to the semiconductor substrate 100D. The semiconductor substrate 100D can be adopted as the semiconductor substrate 100 of the semiconductor device 300.

The semiconductor substrate 100D differs from the semiconductor substrate 100A in the shape of the grooves 10. Each of the plurality of grooves 10 extends annularly in the semiconductor substrate 100D. The plurality of grooves 10 do not intersect with each other on the surface 102. The plurality of grooves 10 are, for example, concentric ellipses or concentric circles centered on the central axis 100Q. FIG. 11 illustrates the radial direction R and the circumferential direction θ. The circumferential direction θ is a direction surrounding the central axis 100Q as its center, which is a counterclockwise direction when viewed along the direction Z.

Figure 12:
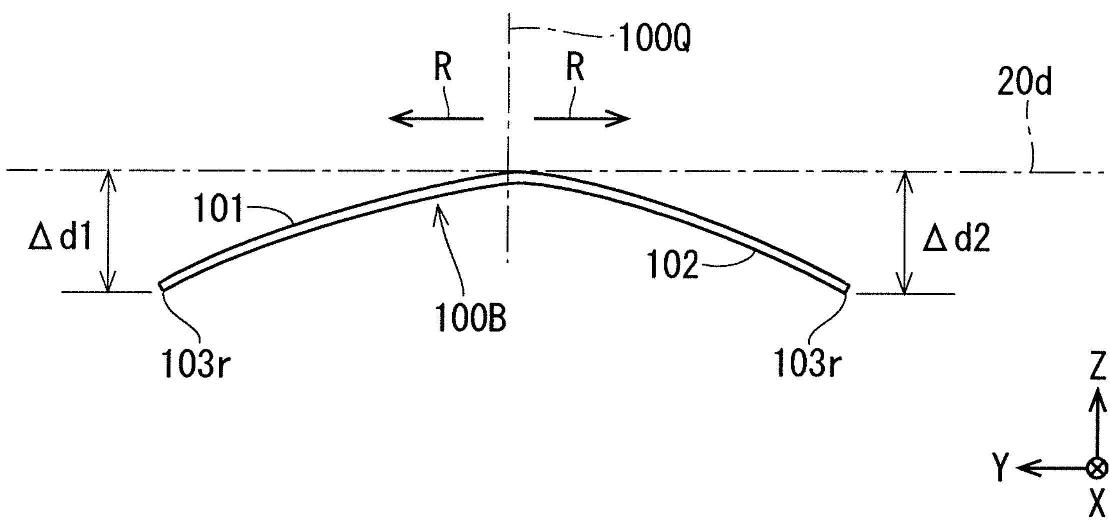
FIG. 12 is a cross-sectional view when the semiconductor substrate has a curved dome shape.
Figure 13:
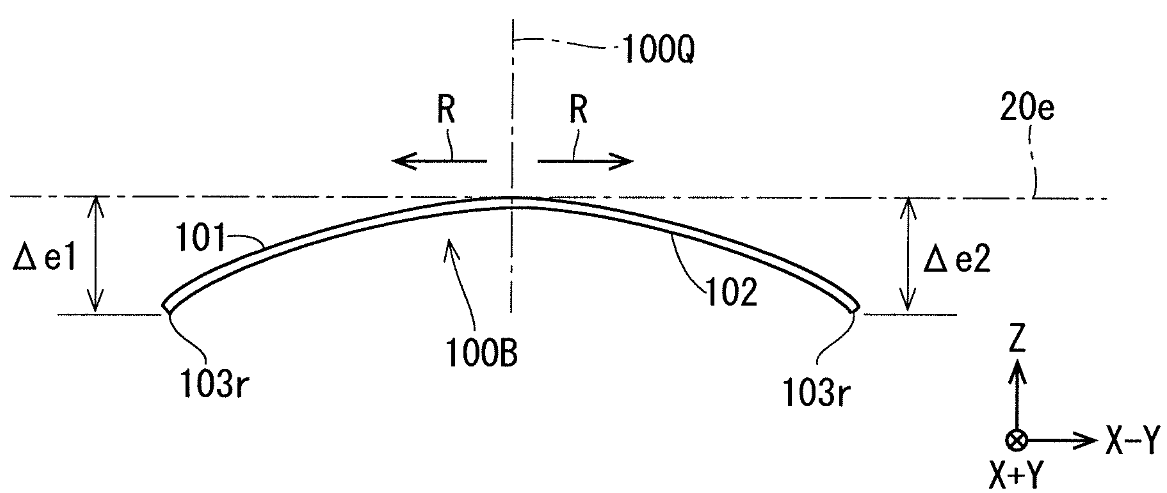
FIG. 13 is a cross-sectional view when the semiconductor substrate has a curved dome shape.

FIG. 12 and FIG. 13 are cross-sectional views of the semiconductor substrate 100B when the semiconductor substrate 100B curves into a dome shape with the surface 101 convex about the center axis 100Q. FIG. 12 is a cross-sectional view taken along the line AA of FIG. 3. FIG. 12 illustrates a cross section including the central axis 100Q of the semiconductor substrate 100B viewed along the direction X. FIG. 13 is a cross-sectional view taken along the line BB of FIG. 3. FIG. 13 illustrates a cross section including the central axis 100Q of the semiconductor substrate 100B viewed along the direction (X+Y). In FIG. 11 to FIG. 13, the direction Z when the semiconductor substrate 100 is not curved is adopted.

In FIG. 12, a position 20*d* indicates the position of the semiconductor substrate 100B on the direction Z side farthest in section view. Here, the position 20*d* indicates the position in the direction Z of the central axis 100Q. A distance Δd1 is a distance, along the direction Z, between a position farthest from the central axis 100Q in the direction Y in section view and the position 20*d*. A distance Δd2 is a distance, along the direction Z, between a position farthest from the central axis 100Q in a direction opposite to the direction Y in section view and the position 20*d*.

In FIG. 13, a position 20*e* indicates the position of the semiconductor substrate 100B on the direction Z side farthest in section view. Here, the position 20*e* indicates the position in the direction Z of the central axis 100Q. A distance Δe1 is a distance, along the direction Z, between a position farthest from the central axis 100Q in the direction opposite to the direction (X−Y) in section view and the position 20*e*. A distance Δe2 is a distance, along the direction Z, between a position farthest from the central axis 100Q in the direction (X−Y) in section view and the position 20*e*. The semiconductor substrate 100B curves along the radial direction, and the distances Δd1, Δd2, Δe1, and Δe2 have approximately the same value. It can be said that the direction the semiconductor substrate 100 is susceptible to warping is the radial direction R. The susceptibility of the semiconductor substrate 100 to warping in this manner tends to become more apparent as the diameter of the semiconductor substrate 100 increases. Further, when the material of the semiconductor substrate 100 is silicon carbide, the warping tends to occur for the reasons described above.

In the present embodiment, the grooves 10 extend along the circumferential direction θ and are aligned along the radial direction R. The grooves 10 are, for example, concentric ellipses or concentric circles centered on the central axis 100Q and extend perpendicularly to the radial direction R.

The grooves 10 in the present embodiment and the grooves 10 in the first embodiment are common in that the grooves 10 extend in a direction perpendicular to the direction in which the semiconductor substrate 100 is susceptible to warping and are aligned along the direction in which the semiconductor substrate 100 is susceptible to warping. Each of the grooves 10 the surface 102 has in the present embodiment reduces warping when the semiconductor substrate 100 is susceptible to warping most in the radial direction. The reduction of the warping reduces the warping of the semiconductor device 300 using the semiconductor substrate 100D as the semiconductor substrate 100. Reduction in the warping of the semiconductor device 300 reduces variations in the extent to which the surface impurity region spreads. Reduction in the variation in the range reduces the variation in the characteristics of the semiconductor device 21 including the surface impurity region.

Third Embodiment

The semiconductor element 21 formed on semiconductor substrate 100 in the first embodiment has a planar structure. In the present embodiment, a case where an element having a trench structure is formed in the semiconductor substrate 100 is exemplified. Any of the semiconductor substrates 100A, 100C, and 100D may be adopted as the semiconductor substrate 100 in the present embodiment.

FIG. 14 is a cross-sectional view illustrating a semiconductor device 400A according to a third embodiment. FIG. 14 is a cross-sectional view of the semiconductor device 400A viewed along the direction Y. The semiconductor device 400A includes the semiconductor substrate 100 and a semiconductor element 22. The semiconductor element 22 is formed in the semiconductor substrate 100.

The semiconductor device 400A differs from the semiconductor device 300 in that a semiconductor element 22 is provided instead of the semiconductor element 21. Regarding the semiconductor device 400A, the description of the contents to which the description of the semiconductor device 300 applies is omitted.

In FIG. 14, the semiconductor element 22 is illustrated as a field effect transistor having a MOS structure. Specifically, the semiconductor element 22 includes a drain electrode 1, a semiconductor layer 2, a well region 3, source regions 4, a gate electrode 13, and a source electrode 8. In FIG. 14, the case is illustrated where the semiconductor element 22 further includes an interlayer insulating film 7, and a barrier metal 9.

In FIG. 14, the gate electrode 13 is located extending from the surface 101 through the well region 3 and the source region 4 along the direction opposite to the direction Z to reach a portion of the semiconductor layer 2 on the surface 101 side. It is noted that the gate electrode 13 is adjacent to the semiconductor layer 2, the well region 3, and the source regions 4 via a gate oxide film (not illustrated). The semiconductor device 22 has a trench structure.

The interlayer insulating film 7 covers the source regions 4, part of the well region 3 adjacent to the source regions 4, and the gate electrode 13 from the side opposite to the surface 102.

Also in such a semiconductor device 400A, variations in the characteristics of the semiconductor element 22 are reduced by adopting the grooves 10 described in the first or second embodiment.

FIG. 15 is a cross-sectional view illustrating another semiconductor device 400B according to the third embodiment. FIG. 15 is a cross-sectional view of the semiconductor device 400B viewed along the direction Y. The semiconductor device 400B differs from the semiconductor device 400A in the positions of the grooves 10. Specifically, the trenches 10 and the gate electrode 13 do not overlap when viewed along the direction Z.

In the present embodiment, the plurality of grooves 10 are aligned along the direction X, each extending along the direction Y. A region S, in which the gate electrode 13 occupies in the direction X, has no trench 10. The absence of trenches 10 facing the gate electrode 13 contributes to preventing the strength of semiconductor substrate 100 from being reduced.

Both of the semiconductor devices 400A and 400B are provided with the terminal portion 23 in the same manner as the semiconductor device 300, for example.

The semiconductor substrates 100A, 100C, and 100D can be adopted as the semiconductor substrate 100 in both semiconductor devices 400A and 400B.

Fourth Embodiment

Figure 16:
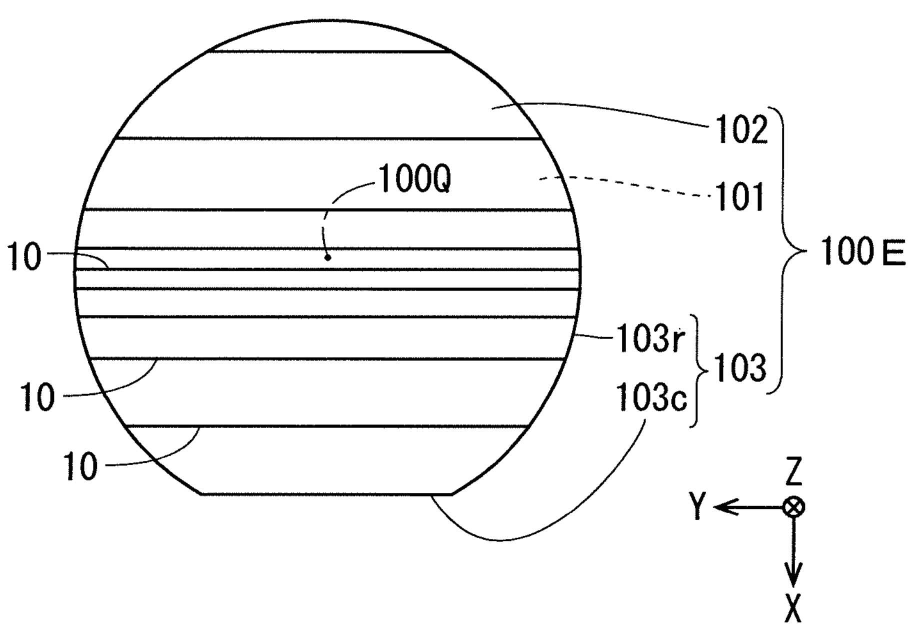
FIG. 16 is a plan view illustrating a semiconductor substrate according to a fourth embodiment.
Figure 17:
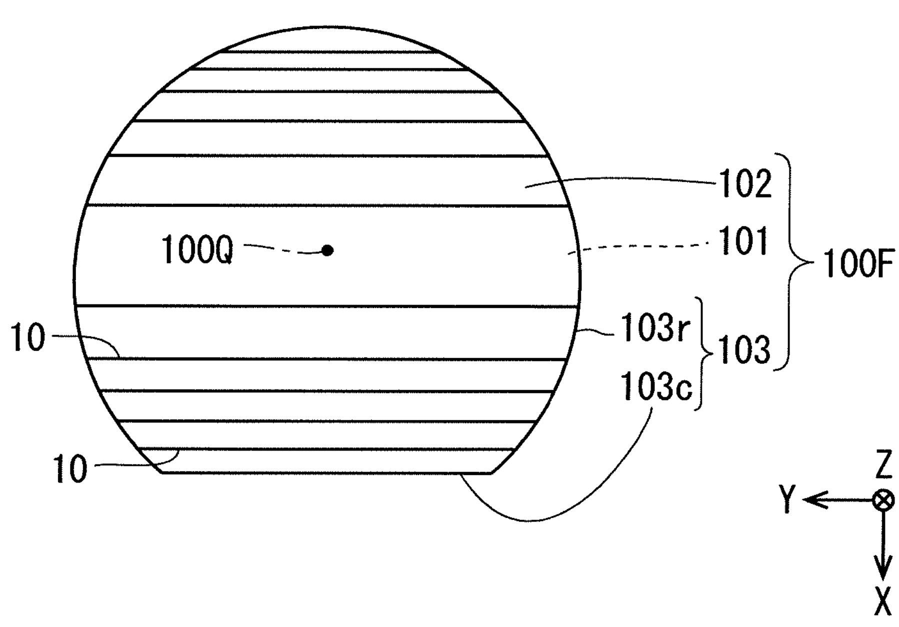
FIG. 17 is a plan view illustrating another semiconductor substrate according to the fourth embodiment.

FIG. 16 is a plan view illustrating a semiconductor substrate 100E according to a fourth embodiment of the present disclosure. FIG. 17 is a plan view illustrating a semiconductor substrate 100F according to the fourth embodiment of the present disclosure. FIG. 16 and FIG. 17 are both plan views viewed along the direction Z. The semiconductor substrate 100E and the semiconductor substrate 100F differ from each other in non-uniformity of the intervals between the grooves 10. Both the semiconductor substrates 100E and 100F are common to the semiconductor substrate 100A, except for the non-uniformity of the intervals between the grooves 10.

In the semiconductor substrate 100E, a distance between a second pair of the grooves 10 adjacent to each other, which is closer to the outline 103 than a first pair is, is wider than a distance between the first pair of grooves 10 adjacent to each other. In the semiconductor substrate 100F, a distance between the second pair of the grooves 10 adjacent to each other, which is closer to the outline 103 than the first pair is, is narrower than a distance between the first pair of grooves 10 adjacent to each other.

Both of the semiconductor substrates 100E and 100F have high rigidity due to the non-uniformity of the intervals between the grooves 10 compared to the case where the intervals are uniform. This high rigidity facilitates the handling of the semiconductor substrates 100E and 100F during transfer thereof.

When the semiconductor substrate 100 is held with the vicinity of the orientation flat 103*c* being interposed, the curve 103*r* on the side opposite to the orientation flat 103*c* is greatly susceptible to warping. When the semiconductor substrate 100 is held with the vicinity of the curve 103*r* being interposed, the vicinity of the orientation flat 103*c* is greatly susceptible to warping.

In the semiconductor substrate 100F, the warping of one or both in the vicinity of the curve 103*r* opposite to the orientation flat 103*c* and in the vicinity of the orientation flat 103*c* is reduced.

The non-uniformity of the intervals between the grooves 10 may be applied to the semiconductor substrates 100C and 100D.

In dome-shaped warping, the vicinity of the outline 103 of the semiconductor substrate 100D is more susceptible to warping than the vicinity of the central axis 100Q. In the semiconductor substrate 100D, the distance between the second pair of the grooves 10 adjacent to each other, which is closer to the outline 103 than the first pair is, being narrower in the radial direction R than the distance between the first pair of grooves 10 adjacent to each other contributes to the reduction of the dome-shaped warping.

Both of the semiconductor substrates 100E and 100F can be adopted as the semiconductor substrate 100 of the respective semiconductor devices 300, 400A, and 400B.

Fifth Embodiment

Figure 18:
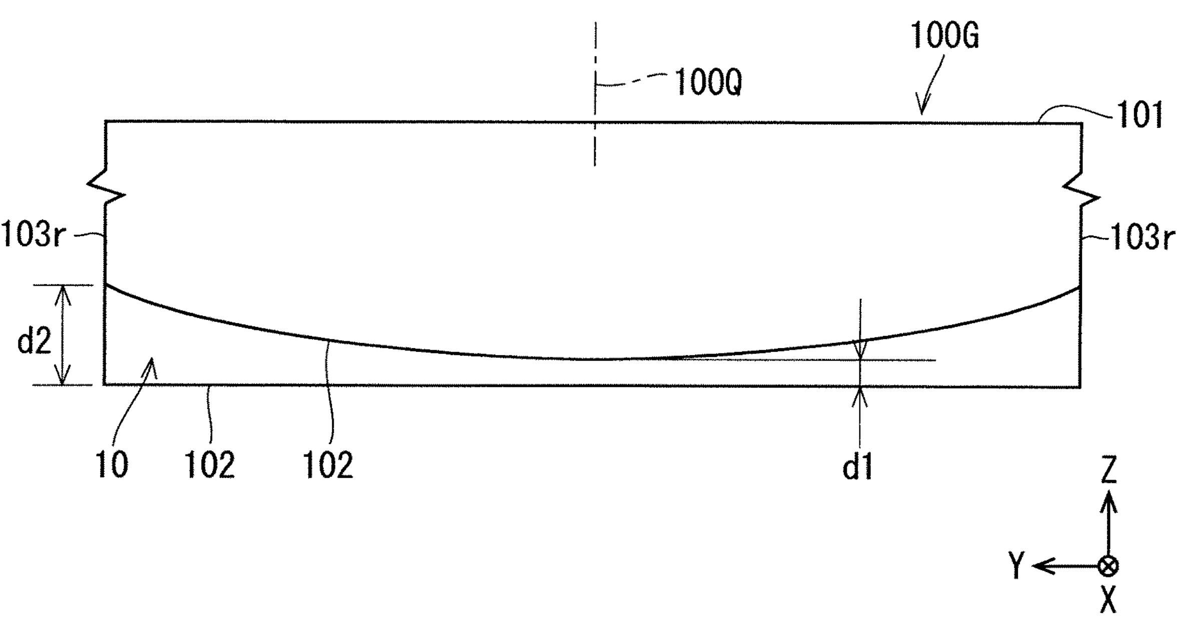

FIG. 18 and FIG. 19 are plan views illustrating a semiconductor substrate 100G according to a fifth embodiment of the present disclosure. FIG. 18 is a cross-sectional view of a cross section including the central axis 100Q viewed along the direction X. FIG. 19 is a cross-sectional view of a cross section including the central axis 100Q viewed along the direction opposite to the direction Y. Whether a groove 10 passes through the central axis 100Q does not matter. FIG. 18 and FIG. 19 illustrate the case where a groove 10 passes through the central axis 100Q.

The semiconductor substrate 100G is common to the semiconductor substrate 100A, except for the non-uniformity of the intervals between the grooves 10. In the semiconductor substrate 100G, the closer to the outline 103 the groove 10 is, the deeper the depth thereof is. Specifically, referring to FIG. 18, the depth d2 of groove 10 in the vicinity of the outline 103 (which appears as curve 103*r* in FIG. 18) on the direction Y side is deeper than the depth d1 of groove 10 in the vicinity of the central axis 100Q. The same is also true for the depth of groove 10 in the vicinity of the outline 103 (which appears as curve 103*r* in FIG. 18) on a side of a direction opposite to the direction Y.

Referring to FIG. 19, it is illustrated that the depth d3 of the groove 10 in the vicinity of the outline 103 (which appears as curve 103*r* in FIG. 19) on a side of a direction opposite to the direction X is deeper than the depth d1 in the vicinity of the center axis 100Q. The same is also true for the depth of groove 10 in the vicinity of the outline 103 (which appears as curve 103*r* in FIG. 19) on the direction X side.

When the semiconductor substrate 100 is held with the vicinity of the orientation flat 103*c* being interposed, the curve 103*r* on the side opposite to the orientation flat 103*c* is greatly susceptible to warping. When the semiconductor substrate 100 is held with the vicinity of the curve 103*r* on the side opposite to the orientation flat 103*c* being interposed, the vicinity of the orientation flat 103*c* is greatly susceptible to warping. In dome-shaped warping, the vicinity of the outline 103 of the semiconductor substrate 100 is susceptible to warping.

In the semiconductor substrate 100G, the closer to the outline 103 the groove 10 is, the deeper the depth thereof is, and the narrower the intervals thereof are. In the semiconductor substrate 100G, the warping of one or both in the vicinity of the curve 103*r* opposite to the orientation flat 103*c* and in the vicinity of the orientation flat 103*c* is reduced. In the semiconductor substrate 100G, in dome-shaped warping, the warping in the vicinity of the outline 103 of the semiconductor substrate 100 is reduced.

In the semiconductor substrate 100C, the closer to the outline 103 the groove 10 is, the deeper the depth thereof may be.

In the semiconductor substrate 100D, the closer to the outline 103 the groove 10 is, the deeper the depth thereof may be. In dome-shaped warping, the vicinity of the outline 103 of the semiconductor substrate 100D is more susceptible to warping than the vicinity of the central axis 100Q.

Sixth Embodiment

A sixth embodiment of the present disclosure describes a method of manufacturing semiconductor devices 300, 400A, and 400B.

Figure 20:
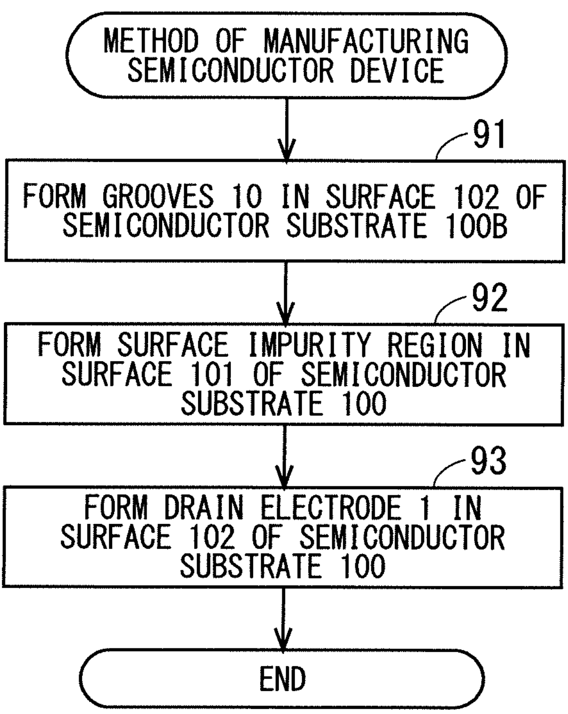
FIG. 20 is a flowchart roughly illustrating a method of manufacturing a semiconductor device according to a sixth embodiment.

FIG. 20 is a flowchart roughly illustrating a method of manufacturing a semiconductor device according to the sixth embodiment. The manufacturing method is roughly divided into a first step 91, a second step 92, and a third step 93 which are executed in this order.

The first step 91 is a step of forming the grooves 10. The grooves 10 are formed in the surface 102 of the semiconductor substrate 100B where no groove 10 is formed. The semiconductor substrate 100 is thus obtained. Examples of the semiconductor substrate 100 include semiconductor substrates 100A, 100C, 100D, 100E, 100F, and 100G.

The second step 92 is a step of forming a surface impurity region in the surface 101. The third step 93 is a step of forming the drain electrode 1 on the surface 102.

Figure 21:
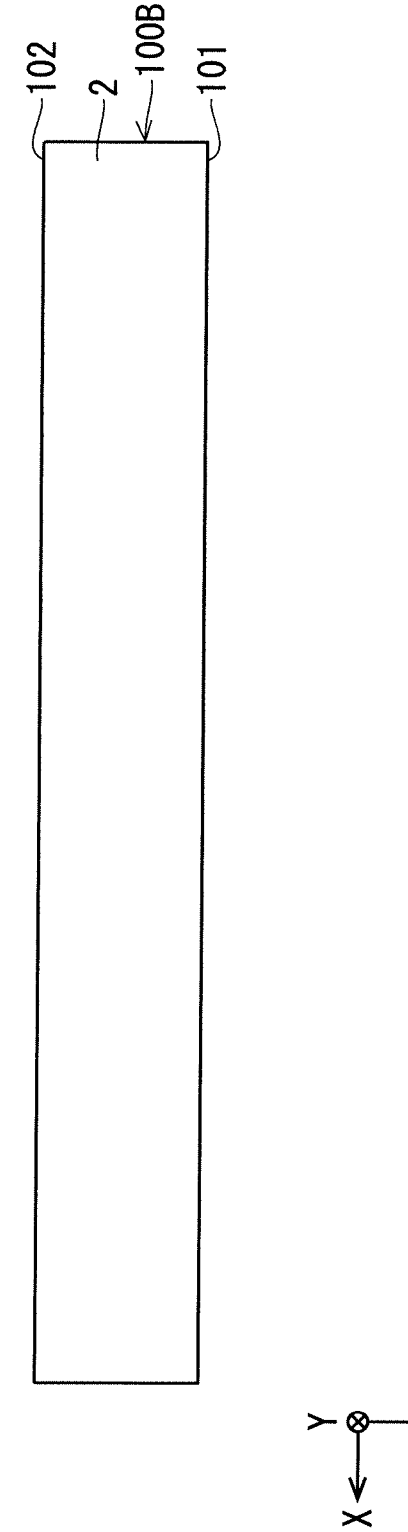

FIG. 21 and FIG. 22 are cross-sectional views illustrating the first step 91. In the following description, for the sake of convenience, a case where the semiconductor substrate 100A is adopted as the semiconductor substrate 100 will be exemplified.

FIG. 21 illustrates a cross section of the semiconductor substrate 100B viewed along the direction Y. FIG. 22 illustrates a cross section of the semiconductor substrate 100A viewed along the direction Y.

The semiconductor substrate 100B is, for example, a silicon substrate or a silicon carbide substrate composed of an epitaxial layer. The semiconductor substrate 100B is, for example, an epitaxial layer of $n^-$-type silicon carbide.

A resist pattern (not illustrated) corresponding to the shape of the grooves 10 is formed by photolithography process on the surface 102. For example, a resist is applied to the surface 102, and openings are formed in predetermined regions of the resist by a photolithography process technique to form a resist pattern.

The grooves 10 are formed by etching silicon or silicon carbide using the resist pattern as a mask. After the grooves 10 are formed, the resist pattern is removed to obtain the semiconductor substrate 100A.

The semiconductor substrates 100C, 100D, 100E, 100F, and 100G are also obtained through the above step. The semiconductor substrates 100A, 100D, 100E, and 100F are obtained by the more simple process than the semiconductor substrate 100C.

The grooves 10 may be formed by processing the semiconductor substrate 100 using dicing or laser dicing. For example, the grooves 10 to obtain the semiconductor substrate 100G may be formed by processing using dicing or laser dicing.

FIG. 23 to FIG. 26 are cross-sectional views illustrating the second step 92 in manufacturing the semiconductor device 300. FIG. 23 to FIG. 26 are cross-sectional views both viewed along the direction Y.

Figure 23:
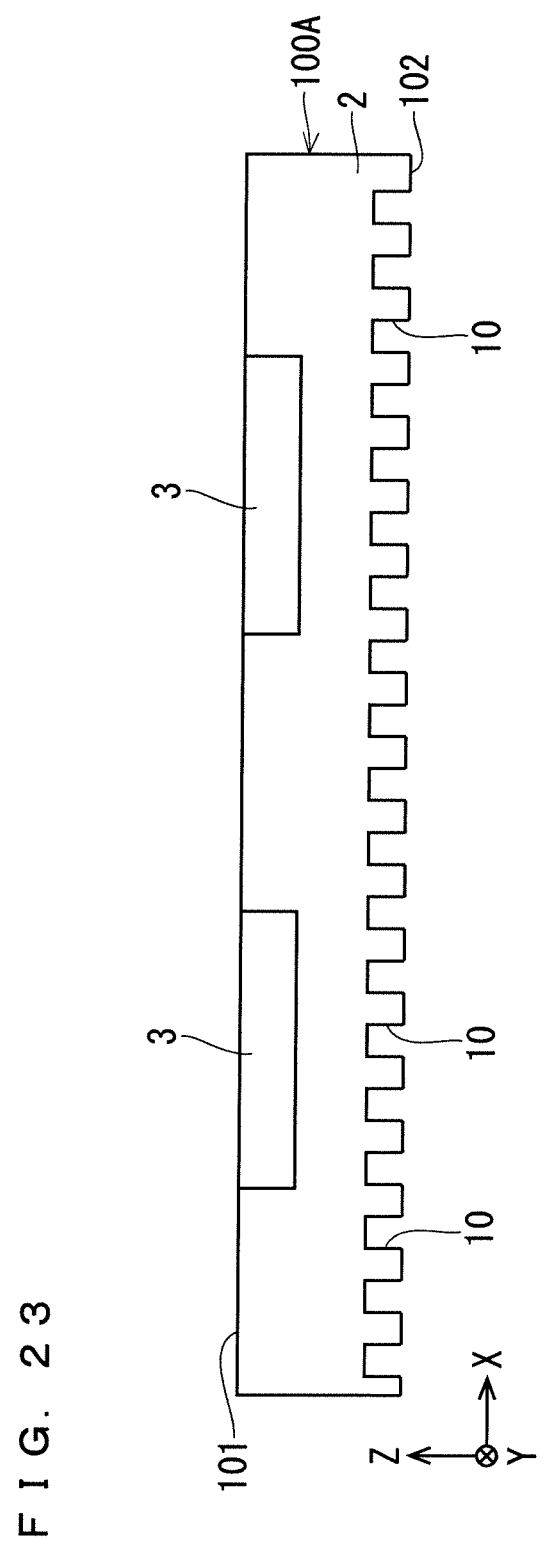

Referring to FIG. 22 and FIG. 23, the well regions 3 are selectively formed in the surface 101 of semiconductor substrate 100A.

A mask (not illustrated) that selectively covers the surface 101 is formed, and p-type impurities such as boron (B) is implanted using the mask. For example, a resist pattern is adopted to the mask. After the impurities are implanted, the impurity ions are diffused by post heat treatment. For example, a plurality of well regions 3 are selectively formed in the surface 101 by the diffusion.

The well regions 3 may have the same p-type impurity concentration. In this case, ions can be implanted all at once, so the productivity of the semiconductor device 300 improves.

The depth of each well region 3 may be the same. In this case, electric field concentration at the well regions 3 is relaxed, and a decrease in breakdown voltage of the semiconductor device 300 is suppressed.

The plurality of well regions 3 may be individually formed using different masks. In this case, the depth of the well regions 3 and the concentration of the p-type impurity can be varied by individually implanting p-type impurity ions.

Figure 24:
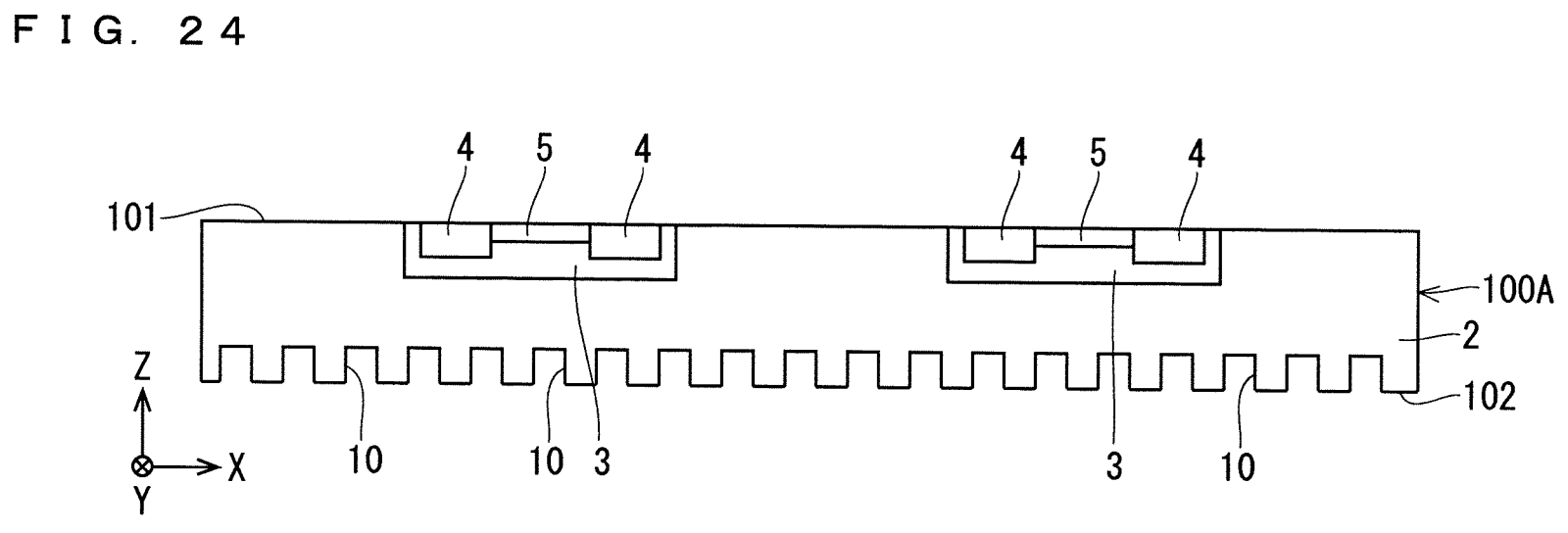

Referring to FIG. 23 and FIG. 24, the source regions 4 and the contact region 5 are selectively formed in the surface 101 of semiconductor substrate 100A. As described above, the contact region 5 may be omitted. The step of forming the contact region 5 may be omitted.

The n-type source regions 4 are formed in the surface 101 side of the well region 3 by selective implantation of n-type impurities using the mask. The implanted n-type impurities are, for example, arsenic (As) or phosphorus (P).

The $p^+$-type contact region 5 is formed in the surface 101 side of the well region 3 by selective implantation of p-type impurities using the mask.

An oxide film ($SiO_2$) is formed on the surface 101 side of the semiconductor substrate 100A (not illustrated) by the structure illustrated in FIG. 24 being subjected to heating in an oxygen-containing atmosphere. The gate electrode 6 is formed by depositing polysilicon doped with n-type or p-type impurities on the oxide film by, for example, Chemical Vapor Deposition (CVD).

Figure 25:
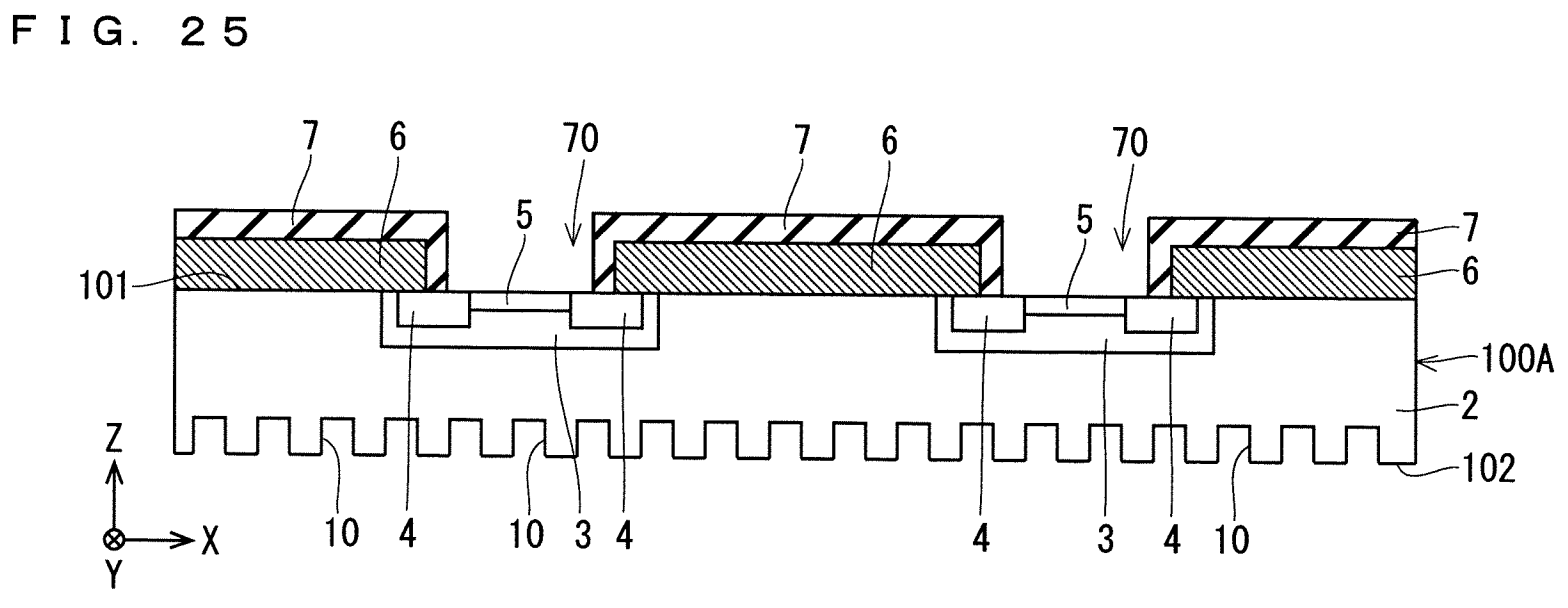

Referring to FIG. 24 and FIG. 25, the interlayer insulating film 7 covering the gate electrode 6 is formed. The interlayer insulating film 7 is, for example, silicon dioxide ($SiO_2$). The interlayer insulating film 7 is formed by thermal oxidation, for example.

A portion of the oxide film formed before the formation of the gate electrode 6, which is not covered with the interlayer insulating film 7, is removed. In the interlayer insulating film 7, a contact hole 70 that exposes the contact region 5 and portions of the source regions 4 contacting the contact region 5 is formed.

Figure 26:
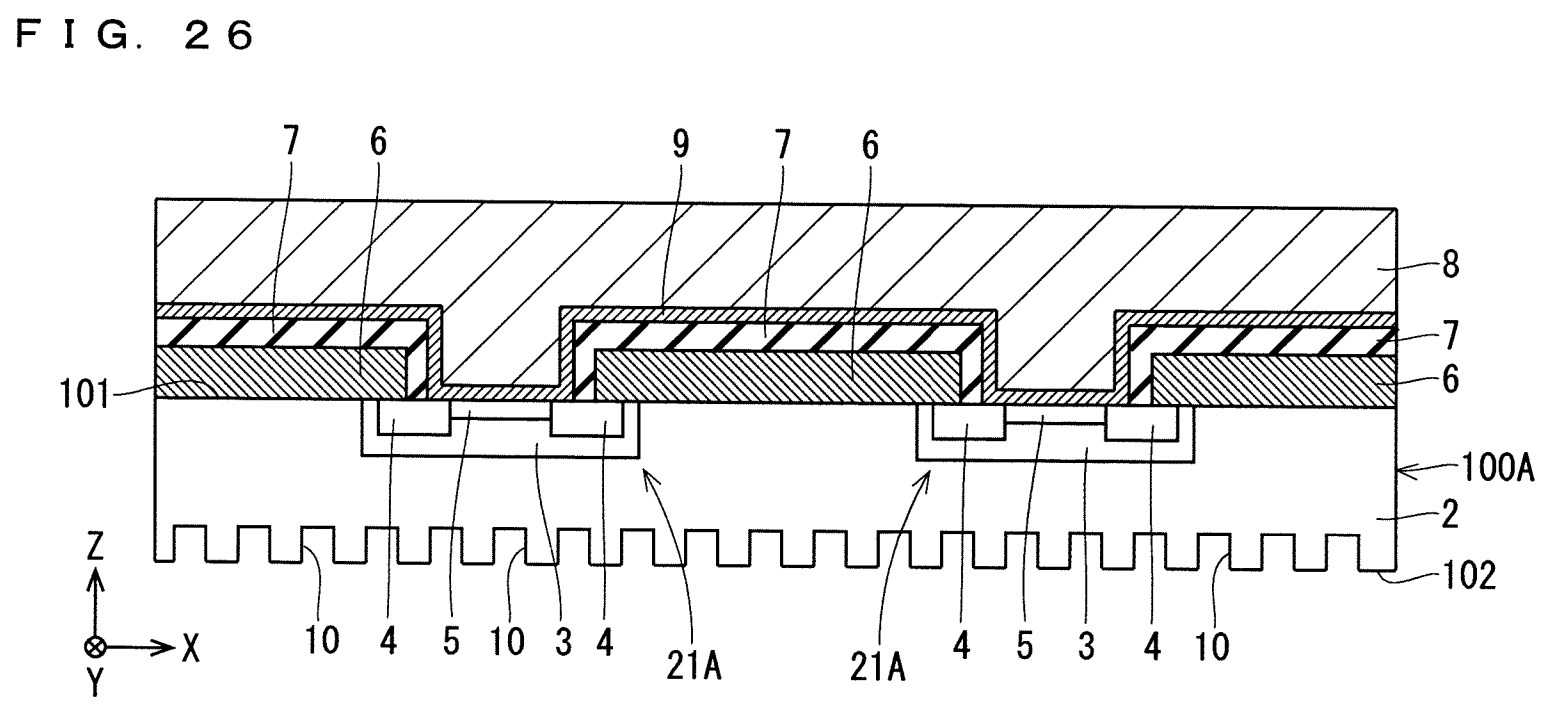

Referring to FIG. 25 and FIG. 26, the barrier metal 9 is formed on the surface 101 and the interlayer insulating film 7. The barrier metal 9 is formed, for example, by forming a titanium film by Physical Vapor Deposition (PVD) or CVD.

The source electrode 8 is formed on the barrier metal 9. The source electrode 8 is formed by depositing an aluminum silicon alloy (Al—Si based alloy) on the barrier metal 9 by PVD, for example. Examples of such PVD include sputtering and vapor deposition.

A semiconductor element 21A is illustrated in FIG. 26. The semiconductor element 21A has a structure in which the drain electrode 1 is eliminated from the semiconductor element 21. The semiconductor element 21A includes a surface impurity region. The terminal portion 23 is also formed in the same manner as the semiconductor element 21A.

A structure in which a nickel alloy (Ni alloy) is further formed by electroless plating or electrolytic plating on the formed aluminum silicon alloy may be adopted as the source electrode 8. When the source electrode 8 is formed by plating, a thick metal film can be easily formed as the source electrode 8. Employing a thick metal film for the source electrode 8 increases its heat capacity and enhances its heat resistance. Such plating may be performed concurrently during the third step 93 or after the third step 93.

The third step 93 will be described with reference to FIG. 26, FIG. 1, and FIG. 9. The drain electrode 1 is formed in contact with the surface 102 in the structure illustrated in FIG. 26. The drain electrode 1 is formed at the position opposite to the semiconductor element 21A and the terminal portion 23. The drain electrode 1 is formed by depositing, for example, an aluminum silicon alloy (Al—Si based alloy) or titanium (Ti) by PVD. Examples of such PVD include sputtering and vapor deposition. The drain electrode 1 may be formed of a stack of a plurality of metals such as an aluminum silicon alloy, titanium, nickel or gold.

A structure in which a metal film is further formed by electroless plating or electrolytic plating on a metal film formed by PVD may be adopted as the drain electrode 1. At this point, plating for the source electrode 8 described above may concurrently be performed.

By forming the drain electrode 1 in this manner, the semiconductor element 21 and the terminal portion 23 are formed, and thus the semiconductor device 300 is manufactured.

The drain electrode 1 may not fill the grooves 10. For example, the drain electrode 1 which does not fill the grooves 10 is obtained by forming the grooves 10 with a depth of several μm and forming the drain electrode 1 with a thickness of several nm (see FIG. 10).

FIG. 27 to FIG. 30 are cross-sectional views illustrating the second step 92 in manufacturing the semiconductor device 400B. FIG. 27 to FIG. 30 are cross-sectional views both viewed along the direction Y.

Figure 27:
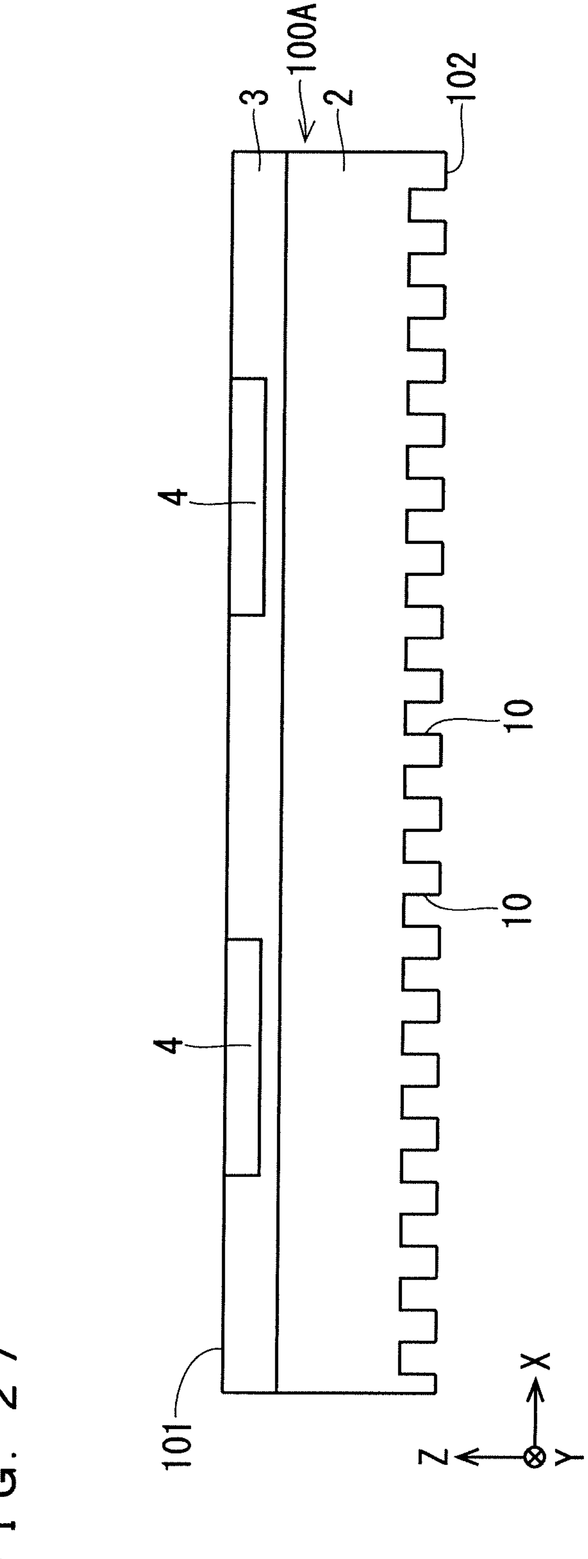

Referring to FIG. 22 and FIG. 27, the well regions 3 and the source regions 4 are formed in the surface 101 of semiconductor substrate 100A. As a method of forming these, for example, a method of forming the well regions 3 and the source regions 4 when manufacturing the semiconductor device 300 is adopted.

Referring to FIG. 27 and FIG. 28, a trench 130 extending from surface 101 through the well region 3 and the source region 4 to reach the semiconductor layer 2 is formed. The gate electrode 13 is formed that fills the trench 130 and is adjacent to the semiconductor layer 2, the well regions 3, and the source regions 4 via a gate oxide film (not illustrated). Polysilicon, for example, is adopted as the material of the gate electrode 13. The method of forming the gate oxide film and the gate electrode 13 is well known; therefore, the description thereof is omitted.

Figure 29:
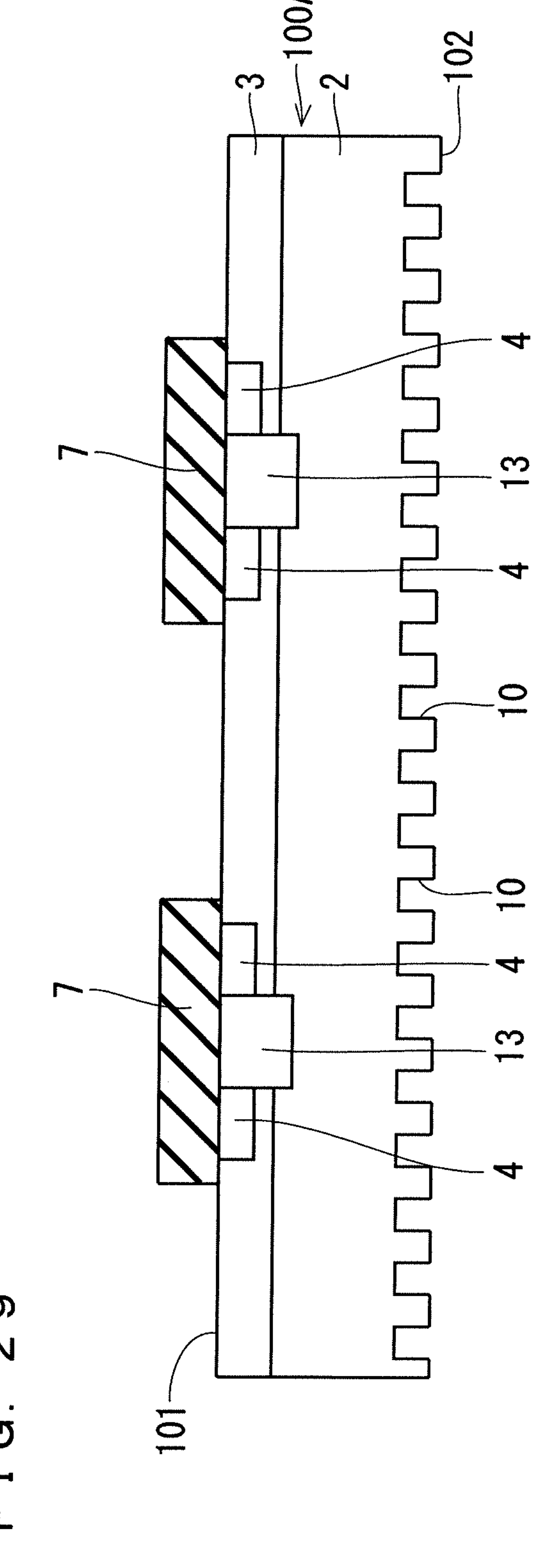

Referring to FIG. 28 and FIG. 29, the interlayer insulating film 7 covering the source regions 4, portions of the well regions 3 adjacent to the source regions 4, and the gate electrode 13 from the opposite side to the surface 102 is selectively formed on the surface 101.

Figure 30:
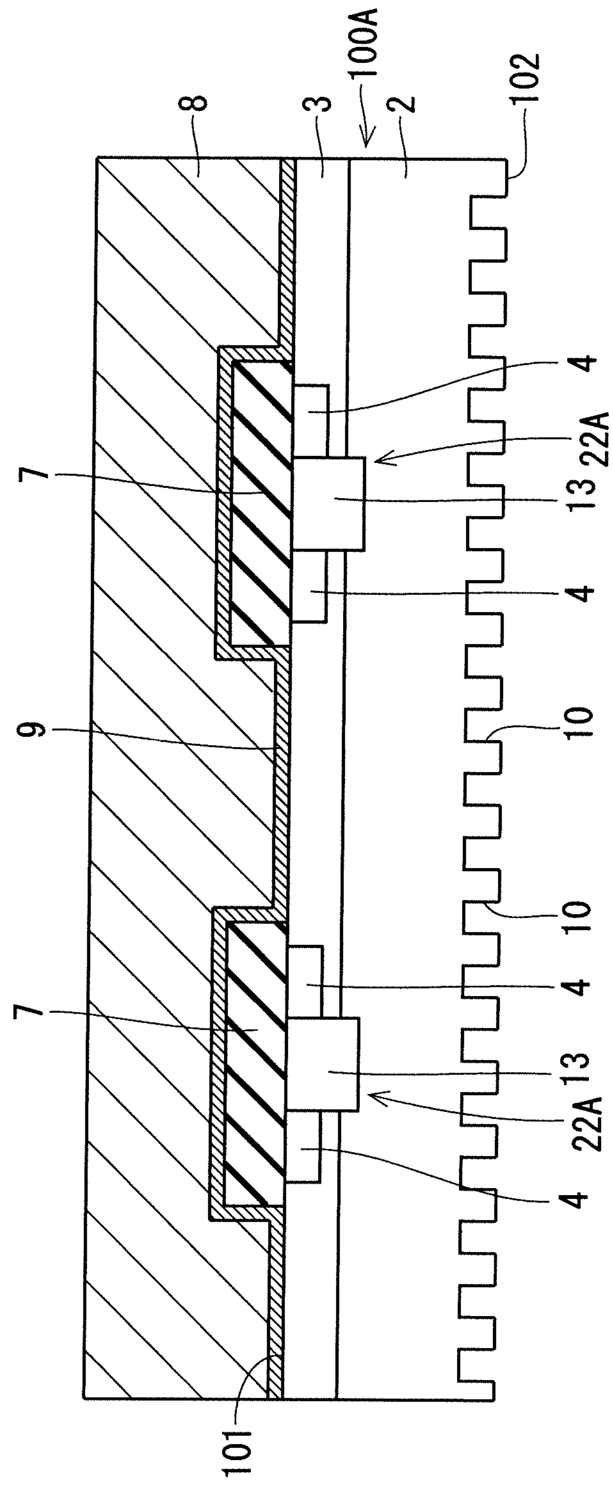
FIG. 30 is a cross-sectional view for illustrating the second step and the third step.

Referring to FIG. 29 and FIG. 30, the barrier metal 9 and the source electrode 8 are formed in the same manner as the semiconductor device 300 is manufactured. As a method for forming these, for example, a method of forming the barrier metal 9 and the source electrode 8 when manufacturing the semiconductor device 300 is adopted.

A semiconductor element 22A is illustrated in FIG. 30. The semiconductor element 22A has a structure in which the drain electrode 1 is eliminated from the semiconductor element 22. The semiconductor element 22A includes a surface impurity region.

The third step 93 will be described with reference to FIG. 30 and FIG. 14. The drain electrode 1 is formed on the surface 102 in the structure illustrated in FIG. 30. As a method of forming the drain electrode 1, for example, a method of forming the drain electrode 1 when manufacturing the semiconductor device 300 is adopted.

By forming the drain electrode 1 in this manner, the semiconductor element 22 is formed, and thus the semiconductor device 400A is manufactured.

When manufacturing the semiconductor device 400B, in the first step 91, the positions at which the grooves 10 are formed are restricted. Specifically, the grooves 10 are not formed at a position opposite to the region S where the trench 130 is to be formed later. Such restriction of the positions of the grooves 10 is implemented by appropriately setting the resist pattern adopted in the first step 91.

As for the semiconductor device 300, a plurality of semiconductor elements 21 and terminal portions 23 are formed on one semiconductor substrate 100, for example, in a matrix. These are appropriately cut off by laser dicing or blade dicing. The same applies to the semiconductor devices 400A and 400B.

Each of the embodiments can be arbitrarily combined, appropriately modified, or omitted.

Hereinafter, various aspects of the present disclosure will be collectively described as appendices.

APPENDIX 1

A semiconductor device including:

a semiconductor substrate having a first surface, a second surface facing the first surface, and an outline; and an impurity region located on a side of the first surface in the semiconductor substrate, in which the second surface has a plurality of concave portions, and each of the plurality of concave portions open toward a side opposite to the first surface and extend along a direction perpendicular to a direction in which the semiconductor substrate is susceptible to warping most.

APPENDIX 2

The semiconductor device according to appendix 1, further including a first electrode in contact with the second surface, in which the conductivity type of the semiconductor substrate at the first surface and that at the second surface coincide with each other.

APPENDIX 3

The semiconductor device according to appendix 2, in which the first electrode does not fill the concave portions.

APPENDIX 4

The semiconductor device according to any one of appendices 1 to 3, in which the outline has an orientation flat, and the plurality of concave portions each extend in parallel to the orientation flat.

APPENDIX 5

The semiconductor device according to any one of appendices 1 to 3, in which the plurality of concave portions each extend annularly and do not intersect with each other on the second surface.

APPENDIX 6

The semiconductor device according to any one of appendices 1 to 5, in which a distance between a second pair of the plurality of concave portions adjacent to each other, the second pair of the plurality of concave portions being closer to the outline than a first pair of the plurality of concave portions is, is narrower than a distance between the first pair of the plurality of concave portions adjacent to each other.

APPENDIX 7

The semiconductor device according to any one of appendices 1 to 6, further including a second electrode extending through the impurity region from a side of the first surface toward the second surface along a direction from the first surface toward the second surface and positioned without overlapping the plurality of concave portions when viewed along the direction.

APPENDIX 8

The semiconductor device according to any one of appendices 1 to 7, in which the closer to the outline each of the plurality of concave portions is, the deeper the depth thereof is.

APPENDIX 9

A method of manufacturing a semiconductor device including:

a first step of forming a plurality of concave portions, to a semiconductor substrate having a first surface and a second surface facing the first surface, in the second surface, each of the plurality of concave portions being open to an opposite side to the first surface;

a second step of forming an impurity region in the first surface, following the first step; and a third step of forming an electrode on the second surface, following the second step.

APPENDIX 10

The method of manufacturing the semiconductor device according to appendix 9, in which, the conductivity type of the semiconductor substrate at the first surface and that at the second surface coincide with each other, and the electrode is in contact with the second surface.

APPENDIX 11

The method of manufacturing the semiconductor device according to appendix 10, in which the electrode does not fill the concave portions.

APPENDIX 12

The method of manufacturing the semiconductor device according to any one of appendices 9 to 11, in which the semiconductor substrate further has an outline including an orientation flat, and the plurality of concave portions each extend in parallel to the orientation flat.

APPENDIX 13

The manufacturing method of the semiconductor device according to any one of appendices 9 to 11, in which the plurality of concave portions each extend annularly and do not intersect with each other on the second surface.

While the disclosure has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:

a semiconductor substrate having a first surface, a second surface facing the first surface, and an outline; and an impurity region located on a side of the first surface in the semiconductor substrate, wherein the second surface has a plurality of concave portions, and each of the plurality of concave portions open toward a side opposite to the first surface and extend along a direction perpendicular to a direction in which the semiconductor substrate is susceptible to warping most, the outline has an orientation flat, and the plurality of concave portions each extend in parallel to the orientation flat.

2. The semiconductor device according to claim 1, further comprising a first electrode in contact with the second surface, wherein the conductivity type of the semiconductor substrate at the first surface and that at the second surface coincide with each other.

3. The semiconductor device according to claim 2, wherein the first electrode does not fill the concave portions.

4. The semiconductor device according to claim 1, wherein a distance between a second pair of the plurality of concave portions adjacent to each other, the second pair of the plurality of concave portions being closer to the outline than a first pair of the plurality of concave portions is, is narrower than a distance between the first pair of the plurality of concave portions adjacent to each other.

5. The semiconductor device according to claim 2, wherein a distance between a second pair of the plurality of concave portions adjacent to each other, the second pair of the plurality of concave portions being closer to the outline than a first pair of the plurality of concave portions is, is narrower than a distance between the first pair of the plurality of concave portions adjacent to each other.

6. The semiconductor device according to claim 1, further comprising a second electrode extending through the impurity region from a side of the first surface toward the second surface along a direction from the first surface toward the second surface and positioned without overlapping the plurality of concave portions when viewed along the direction.

7. The semiconductor device according to claim 1, wherein the closer to the outline each of the plurality of concave portions is, the deeper the depth thereof is.

8. The semiconductor device according to claim 2, wherein the closer to the outline each of the plurality of concave portions is, the deeper the depth thereof is.

9. The semiconductor device according to claim 1, wherein wherein the orientation flat is parallel to a <11-20> axis of crystal orientation of the semiconductor substrate.

* * * * *